United States Patent [19]

Sakai et al.

[11] Patent Number: 4,749,888
[45] Date of Patent: Jun. 7, 1988

[54] JOSEPHSON TRANSMISSION LINE DEVICE

[75] Inventors: Shigeki Sakai; Hiroshi Akoh; Hisao Hayakawa, all of Ibaraki; Akihiko Yagi, Kumamoto, all of Japan

[73] Assignees: Agency of Industrial Science & Technology; Ministry of International Trade & Industry, both of Tokyo, Japan

[21] Appl. No.: 45,152

[22] Filed: May 4, 1987

Related U.S. Application Data

[63] Continuation of Ser. No. 694,342, Jan. 24, 1985, abandoned.

[30] Foreign Application Priority Data

Jan. 25, 1984 [JP] Japan ................................ 59-11147
Jan. 25, 1984 [JP] Japan ................................ 59-11148
Feb. 14, 1984 [JP] Japan ................................ 59-25751

[51] Int. Cl.$^4$ ............................................. H03K 19/195
[52] U.S. Cl. ...................................... 307/476; 307/306; 357/5; 377/93; 333/995
[58] Field of Search ............... 307/462, 476, 277, 306; 357/5; 365/162; 333/995; 377/93

[56] References Cited

U.S. PATENT DOCUMENTS

| 3,676,718 | 7/1972 | Anderson et al. | 307/306 |
| 3,936,677 | 2/1976 | Fulton et al. | 307/306 |
| 4,361,768 | 11/1982 | Rajeevakumar | 307/306 |

*Primary Examiner*—John Zazworsky
*Attorney, Agent, or Firm*—Oblon, Fisher, Spivak, McClelland & Maier

[57] ABSTRACT

A Josephson transmission line device comprising a Josephson transmission line consisting of a pair of superconducting layers and a junction layer disposed between the superconducting layers to constitute a Josephson junction; a fluxon stopping position constituted by at least one resistor element in at least a part of the Josephson transmission line; a fluxon driving current source connected to the resistor element; a fluxon generating current source connected to the Josephson transmission line for generating fluxons therein; and an output circuit for extracting the fluxons generated in the Josephson transmission line as output signals. Fluxons generated in the Josephson transmission line can be made to stop at and depart from the stopping positions by selective application of fluxon driving current. Therefore, the Josephson transmission line can, alone or in combination with other such lines, be made to operate as compact, high-speed, low power-dissipation Josephson electronic circuit devices capable of functioning as logic circuits, memories, pulse generators, etc.

50 Claims, 24 Drawing Sheets

FIG.30C
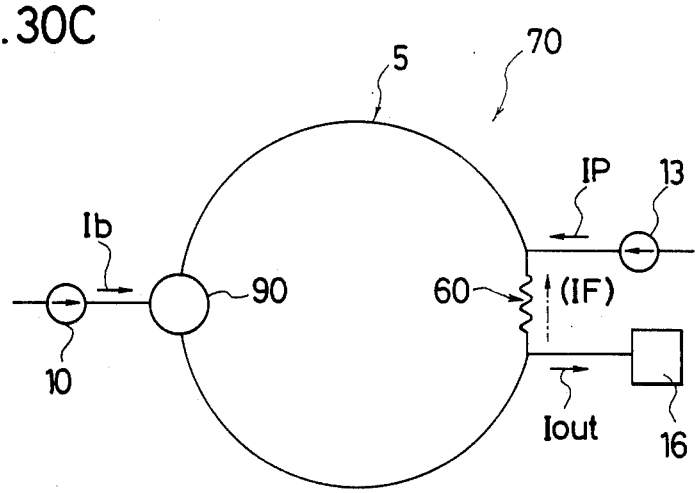
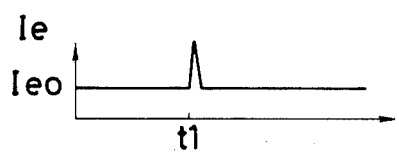
FIG.31A
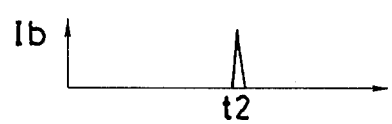
FIG.31B
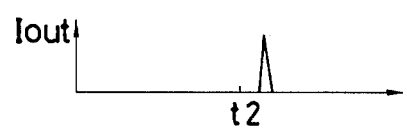
FIG.31C
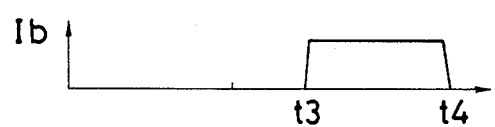
FIG.31D
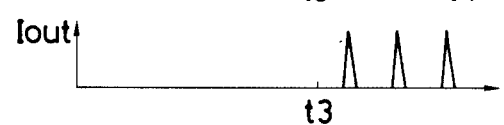
FIG.31E
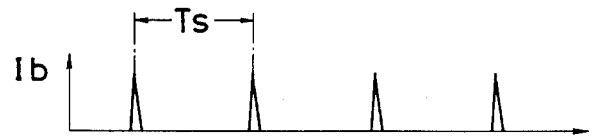
FIG.32A
FIG.32B

JOSEPHSON TRANSMISSION LINE DEVICE

This application is a continuation of application Ser. No. 694,342 filed on Jan. 24, 1985, now abandoned.

FIELD OF THE INVENTION

This invention relates to a Josephson transmission line device which when used with various current sources and output circuits is capable of performing a variety of digital functions by use of flux quanta referred to as fluxons.

BACKGROUND OF THE INVENTION

Recent years have seen very rapid progress in the field of cryoelectronics. In particular, Josephson junction devices, with their high speed and low power dissipation, have come to show great promise as future digital devices.

In the Josephson devices developed up to now, however, the "0" and "1" logic values have been defined in terms of the voltage state across the junction. More specifically, the state in which the phase difference between the macroscopic wave-functions remains in circulation between the superconducting layers of the junction is defined as the logic value "0" or "1" while the other state, that is the zero-voltage state is defined as the other logic value. Therefore, although the power dissipation is indeed lower than that of semiconductor devices, it cannot be said that reduction of power dissipation has yet been pushed to the limit.

It is known that in a Josephson junction structure which is longer in one direction than the Josephson penetration depth a vortex current state will, under specific conditions, arise and persist, and, moreover, that it is possible to cause the vortex current distribution to propagate at high speed. The magnetic flux passing through the loop of the vortex current at this time is quantized and the quantized superconducting state behaves as an independent quantum. This vortex current and flux quantum are commonly referred to as a fluxon. A fluxon can be caused to propagate along a Josephson transmission line but since the voltage arising because of the propagation causes quasi-particle current, there is a gradual loss of energy which results in a decline in the propagation velocity. By applying an appropriate bias current perpendicularly to the junction, however, it is possible to supply energy to the fluxon, making it possible to increase the propagation velocity at will. Also, because of the Lorentz force arising between the magnetic flux and the bias current, it is possible to slow down the propagation velocity of the fluxon by applying as a damping current a bias current in the reverse direction from that mentioned above. Use of such fluxons as carriers of information will make it possible to realize a device with exceedingly low power dissipation.

A device employing fluxons within a Josephson junction structure has been disclosed in U.S. Pat. No. 3,676,718. In a device which employs fluxons as carriers of information it is intrinsically necessary to be able to start and stop propagation of the fluxons as desired. In order to make it possible to stop fluxons in an extended Josephson device, the invention of the aforesaid US patent provides portions on the Josephson structure where there is established a local minimum of the sum of the magnetic energy plus the Josephson coupling energy. In order to examine the performance and the inherent problems of the proposed device, it will be useful to take a look at the concrete structures which are used to provide stopping positions, i.e. positions at which the sum of the two energies is minimum. There are five such structures proposed in the specification of this patent:

A. Provision of regions where the Josephson critical current density is zero;

B. Varying the thickness of the Josephson junction oxide layer in the lengthwise direction of the extended Josephson device;

C. Provision of point sources of magnetic field at periodic points so as to enable minimization of energy;

D. Periodic application of currents to the extended Josephson device to enable minimization of energy; and E. Providing variable self-inductance in the lengthwise direction of the extended Josephson device.

In the methods A, B and E, since the characteristic impedance of the extended Josephson structure encountered by the rapidly propagated fluxons differs between the stopping positions and the traveling regions, there is the disadvantage that the conditions under which the fluxons are caught by the stopping positions are too limited. Moreover, in the case of method B involving variation of the thickness of the oxide layer, there is the further disadvantage of the device fabrication process being made complex.

In methods C and D, it is necessary to minimize the energy by application of signals from outside (magnetic field in the case of method C and current in the case of method D), which disadvantageously complicates the device circuitry.

Further disadvantageously, in all of the methods of the patent it takes a considerable amount of time before a fluxon comes to complete rest at the position of minimum energy and this constitutes a bar to increasing the propagation clock rate of the fluxons to an extremely high level.

From the foregoing it can be seen that the prior art, including the above-mentioned U.S. patent, involves a number of intrinsic defects which prevent the realization of a practical extended Josephson device employing the behavior of fluxons, so that up to now there has been little promise of realizing high-performance devices capable of stable operation.

SUMMARY OF THE INVENTION

The primary object of the present invention is to provide a Josephson transmission line device comprising a Josephson transmission line which constitutes an electronic device employing the behavior of fluxons (magnetic flux quanta), which Josephson transmission line device is so constituted that stopping positions at which fluxons can stop stably and effectively can be easily formed in the Josephson transmission line.

Another object of the present invention is to provide a Josephson transmission line device which has the potential of being reduced to an extremely low level of power dissipation and which is highly amenable to the incorporation of a broad range of digital functions including memory function, shift register function, logic AND function and logic OR function.

These objects of the present invention are attained by the provision of a Josephson transmission line device comprising a Josephson transmission line consisting of a pair of superconducting layers and an intermediate junction, at least one fluxon stopping position provided on the Josephson transmission line by the use of a resistor element, at least one fluxon generating current source connected across said pair of superconducting layers, and at least one fluxon driving source connected between said superconducting layers at the fluxon stopping position.

The fluxon stopping position is constituted by providing the resistor element in parallel with either the Josephson junction or the self-inductance of the Josephson transmission line.

The fluxon generating current source connected between the superconducting layers causes the formation within the Josephson transmission line constituted of the superconducting layers and the junction therebetween of a unidirectional vortex current which supports one flux quantum (fluxon). The generated fluxon travels along the Josephson transmission line until it reaches and stops at the fluxon stopping position formed by the resistor element. Then if a bias current is applied to the fluxon stopping position as a driving current by the fluxon driving source, the fluxon is caused to leave the fluxon stopping position and resume its travel. The direction of the travel at this time is determined by the direction of the bias current If it is arranged so that the fluxon driving source is put into operation at a suitable time following the generation of the fluxon in the Josephson transmission line by the fluxon generating current source, it is possible to constitute a programmable timer for logic information.

If the fluxon stopping position is used as a data memory region, the fluxon generating current source is used for writing data into the data memory region and the fluxon driving source is used for commanding data read-out, there can be constituted on the basis of the aforesaid principle a destructive read-out memory.

If, in order to reflect the fluxon at the open end of the superconducting layers, only a part of the energy of the fluxon is output from the open end and the remainder is changed in flux direction to be reflected back to the fluxon stopping position to be stored there again, it is possible to constitute a nondestructive read-out memory.

Moreover, by applying these same functions in a Josephson transmission line device provided with a plurality of fluxon generating current sources, fluxon driving sources and fluxon stopping positions (ohmic regions), or in an arrangement comprising a plurality of such devices in combination, it is possible to constitute Josephson transmission line devices not only with memory and shift register capability but also with logic AND, logic OR and other logic circuit functions as well as with various digital and analog data processing capabilities.

BRIEF DESCRIPTION OF THE DRAWINGS

These and other objects of the invention will be more easily understood from the following detailed description made with reference to the accompanying drawings, wherein:

FIGS. 30(A) to (C) are schematic views for explaining an eighteenth embodiment of the invention;

FIGS. 31(A) to (E) are time charts for the operation of the device shown in FIG. 30;

FIGS. 32(A) and (B) are time charts for another mode of operation of the device shown in FIG. 30;

DETAILED DESCRIPTION OF THE PREFERRED EMBODIMENTS

Before going into a detailed explanation of the Josephson transmission line device according to this invention, it will be helpful to discuss the basic operating principle of the conventional Josephson device which is technically related to that according to the present invention.

Referring to FIGS. 1(A) to (D), it is known that in a Josephson junction structure which is longer in one direction than the Josephson penetration depth $\lambda_J$, a vortex current state will, under specific conditions, arise and persist, and moreover, that it is possible to cause the vortex current distribution to propagate at high speed.

This will now be explained more concretely with reference to FIG. 1(A) which shows a Josephson junction structure consisting of a pair of superconducting layers 2,3 contiguous with each other via a junction 4. The length (l) of one side of the structure is about four or more times the Josephson penetration depth $\lambda_J$ while the width (w) of the structure (the width of the transmission line) is smaller than $\lambda_J$. Thus, in overall configuration the Josephson junction structure is line-shaped, being much greater in length than in width. In such a structure, it is possible to produce an internal vortex current a which supports a local magnetic field H. A Josephson junction structure of this type is referred to as a Josephson transmission line.

Figure 1A:
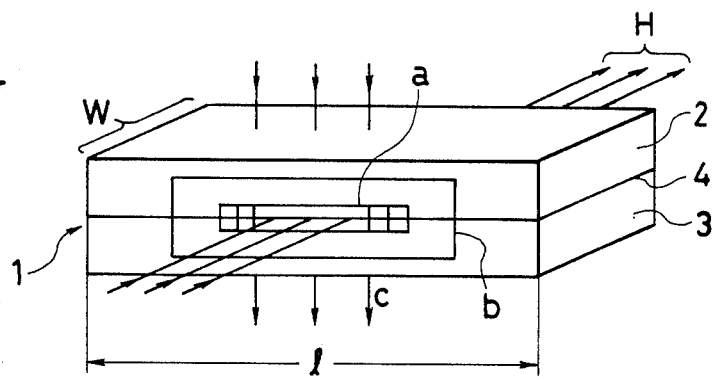
FIG. 1(A) is a schematic view for explaining the operation of a conventional Josephson transmission line device.
Figure 1B:
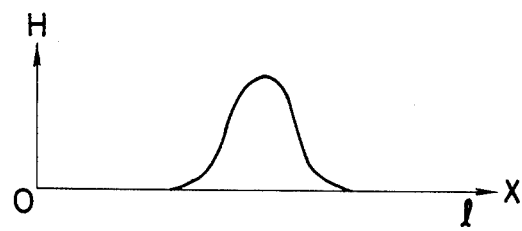
FIG. 1(B) shows a characteristic curve of the localized state of the magnetic field in a Josephson transmission line device.

FIG. 1(B) is a graph with the lengthwise direction of the Josephson transmission- line of FIG. 1(A) represented on the x-axis and the magnetic field H represented on the y-axis. The curve thus shows the local nature of the magnetic field H. It will be noted that the spacial distributions of the vortex current and the magnetic field are about the same, both being in the range of about $\lambda_J \sim 4\lambda_J$.

In FIG. 1(A), if the outer edge of the vortex current (where almost total attenuation of the vortex current can be presumed) is taken to be defined by the loop b, then the total magnetic flux passing through this loop is quantized and equal to a single flux quantum $\Phi_0 (2.07 \times 10^{-15}$ Wb). This quantized vortex current state behaves like an independent entity within the Josephson transmission line and is therefore referred to as one "fluxon."

The fact that the total magnetic flux is equal to $\Phi_0$ means that the change of the phase difference between the two superconductors in the region where the fluxon exists corresponds to precisely $2\pi$. Therefore, by using fluxons which have a phase difference of $2\pi$ and are consequently of the minimum size possible as information carriers, it would seem possible to realize a device with exceedingly small power dissipation.

As was mentioned in the foregoing, a fluxon can be made to travel along the Josephson transmission line. At this time, the voltage arising because of the propagation gives rise to quasi-particle current, resulting in a gradual loss of energy that causes the propagation velocity to decrease. If, however, as shown in FIG. 1(A), an appropriate bias current is applied in the direction of the arrows c, energy will be supplied to the fluxon, making it possible to increase the propagation velocity. Further, because of the Lorentz force arising between the magnetic flux and the bias current, it is possible to slow down the propagation velocity of the fluxon by applying as a damping current a bias current in the direction opposite to that of the arrows c.

The maximum velocity of the fluxon is $1/(LC)^{\frac{1}{2}}$, where L and C are the impedance per unit length and the capacitance per unit length of the Josephson transmission line. In a Josephson transmission line such as illustrated in FIG. 1(A) wherein the junction 4 is a layer of an insulating material, it is possible to attain an exceedingly high maximum fluxon propagation velocity $\bar{c}$ of at least around one-tenth the speed of light in a vacuum (about $3.0 \times 10^8$ m/sec).

Figure 1C:
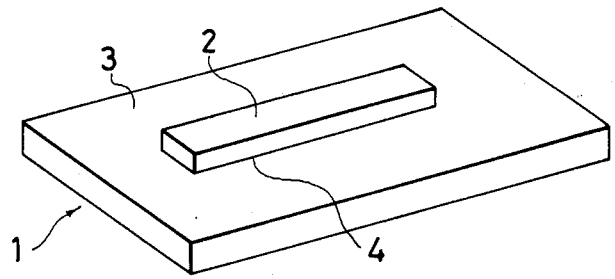
FIGS. 1(C) and (D) are schematic views showing modified forms of the conventional Josephson transmission line device.
Figure 1D:
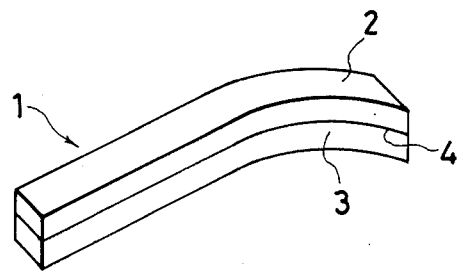

Here it should be noted that the properties of the Josephson transmission line described in the foregoing are also obtained in a structure wherein one superconducting layer 3 is much larger in area than the other superconducting layer 2, as shown in FIG. 1(C), or wherein the overall structure is made arcuate or deformed, as shown in FIG. 1(D).

Figure 2A:
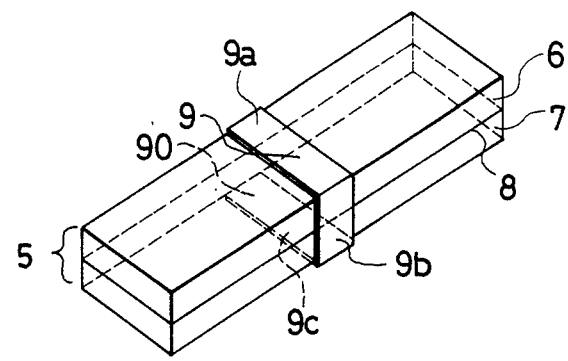
FIG. 2(A) is a schematic view showing the basic structure of a first embodiment of the Josephson transmission line device according to the present invention.

The present invention provides an improved Josephson transmission line device based on the basic Josephson transmission line structure described above. The principle behind the physical structure of the device according to the invention is illustrated in FIG. 2(A) showing a first embodiment.

Like the conventional Josephson transmission line device described above, the Josephson transmission line device according to this invention also employs a structure wherein a Josephson transmission line 5 is constituted of a pair of upper and lower superconducting layers 6 and 7. What characterizes the Josephson transmission line device according to this invention is that at least one portion of the Josephson transmission line 5 is formed with a resistor element 9 connecting the pair of upper and lower superconducting layers 6,7 joined via an intermediate junction layer 8 to form a fluxon stopping position 90.

The resistor element 9 comprises portions 9a,9c contiguous with the upper and lower surfaces of the transmission line and a connecting region 9b which lies along the side wall of the transmission line and connects the portions 9a,9c, the overall configuration being like a letter U laid on its side. Moreover, the arrangement is such that connecting portion 9b linking the two superconducting layers is in direct contact with the side edges of the superconductor layers 6,7. As a result, even though the equivalent resistance between the two superconducting layers at the resistor element 9 exists in the connecting portion 9b, it is substantially present only in the portion passing over the junction layer 8. Therefore the resistor element 9 can alternatively be constituted without the portions 9a,9c, only by the connecting portion 9b. The method of applying the resistor element will be discussed later.

Figure 2B:
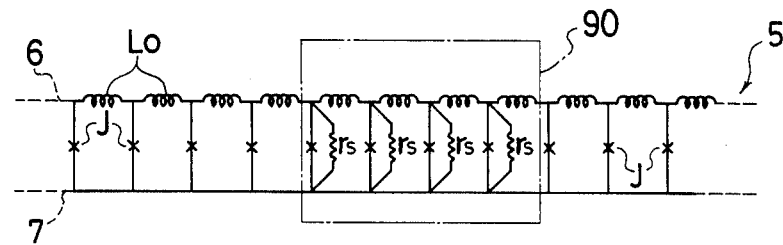
FIG. 2(B) is a diagram for explaining the functional principle of the Josephson transmission line device shown in FIG. 2(A)

An equivalent circuit of this basic device structure is shown in FIG. 2(B). As will be noted, the device can be represented as a plurality of Josephson junctions J and parallel ohmic components $r_s$ connected between the two superconducting layers 6,7.

The operation of this basic embodiment will now be discussed with reference to FIGS. 3(A)-(D).

Figure 3A:
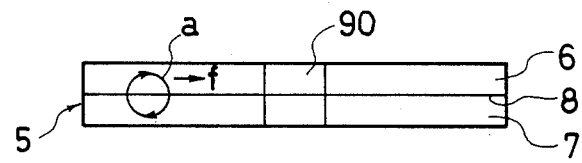
FIGS. 3(A) to (D) are schematic views showing the operating principle of the Josephson transmission line device shown in FIG. 2.

As was mentioned earlier, under specific conditions, a fluxon produced within the transmission line will travel along the line. First, presume that as shown in FIG. 3(A), a fluxon a of the direction shown by the arrows is generated from an appropriate fluxon generating source at one end of the Josephson transmission line of this embodiment and begins to travel in the direction of the arrow f.

When the fluxon a enters the fluxon stopping position 90 (FIG. 2(B)), namely the resistor region constituted by the application of the resistor element 9, the voltage arising across the Josephson junction at the position of the fluxon during its travel comes to be applied not only across the Josephson junction but also across the position 90. As a result, the fluxon loses energy and the voltage drops sharply at the resistor region 9. In other words, the kinetic energy of the fluxon drops suddenly, preventing the fluxon from moving beyond the fluxon stopping position 90.

Figure 3B:
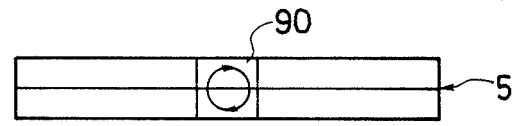

As was mentioned earlier, however, a fluxon intrinsically possesses a flux corresponding to a single flux quantum so that it is not annihilated but, as shown in FIG. 3(B), stops at the stopping position 90 where it stays in the form of a vortex current.

If, however, a stopping position at which a fluxon has come to rest is supplied with a bias or driving current, the fluxon will again begin to propagate. More specifically, as shown in FIG. 3(C), if a driving current $I_b$ is applied in the direction shown in the figure, the fluxon a will, by dint of the Lorentz force it receives from the current $I_b$, again begin to move in the direction indicated by the arrow f.

Figure 3C:
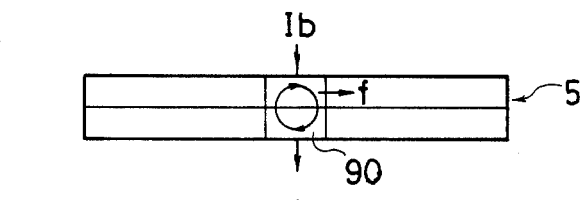
Figure 3D:
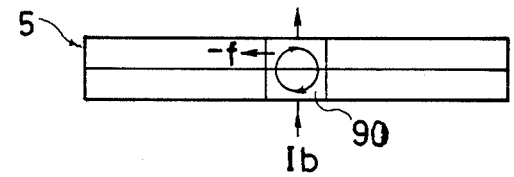

On the other hand, if the driving current is applied in the opposite direction as shown in FIG. 3(D), the fluxon a will begin to travel in the opposite direction indicated by the arrow $-f$.

In the case of a fluxon $\bar{a}$ whose vortex current circulates in the reverse direction from that of the fluxon discussed up to this point, the application of the driving current $I_b$ in the directions shown in FIGS. 3(C) and (D) will of course cause the fluxon to travel in the opposite direction from that shown in the same figures. In either case, the velocity of the fluxon which is again caused to propagate can be controlled by adjusting the magnitude of the applied bias current or selected driving current.

The provision of stopping positions by the application of one or more resistor elements on the Josephson transmission line in accordance with the present invention results in a number of advantages not realizable by conventional techniques. For example, (1) no difference arises in the characteristic impedance of the Josephson transmission line between the stopping position and other regions, (2) no complications are encountered in the fabrication of the device, (3) the device can be realized with simple circuitry, and (4) the fluxon comes to rest at the stopping position in a short time so that the fluxon transfer clock rate can be maximized.

Figure 4A:
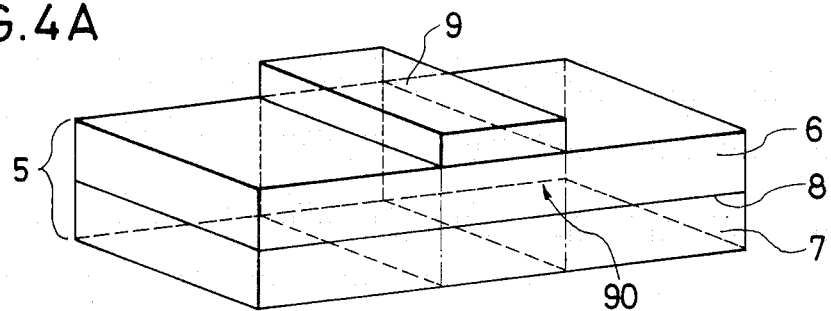
FIG. 4(A) is a schematic view showing the basic structure of a second embodiment of the invention.

Another method of forming at least one stopping position which constitutes one of the constituent elements of the present invention is schematically shown in FIG. 4(A) relating to a second embodiment of the invention.

Also in this embodiment the structure of the Josephson transmission line 5 consists of a pair of upper and lower superconducting layers 6,7 with a junction 8 therebetween, which is the same as that of the prior art. What characterizes this embodiment is that the Josephson transmission line 5 of such structure is provided at at least one point along its length with a resistor element 9 on at least one of its superconducting layers (the upper superconducting layer 6 in the illustrated embodiment).

Figure 4B:
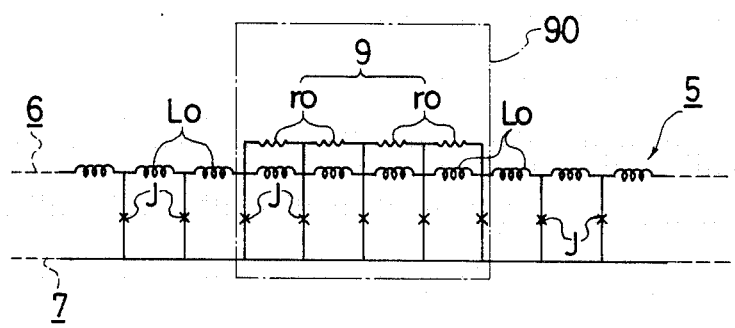
FIG. 4(B) is a diagram for explaining the functional principle of the embodiment shown in FIG. 4(A)

An equivalent circuit of a device having this basic structure is shown in FIG. 4(B) from which it will be noted that the arrangement can be represented as a plurality of Josephson junctions J between the upper and lower superconducting layers 6,7 and a plurality of series connected inductance components $L_o$ plus resistance components $r_o$, resulting from the provision of the resistor elements 9, connected in parallel with the inductance components $L_o$, in the stopping position 90.

The operation of this basic embodiment will now be considered with reference to FIGS. 5(A)-(D).

Figure 5A:
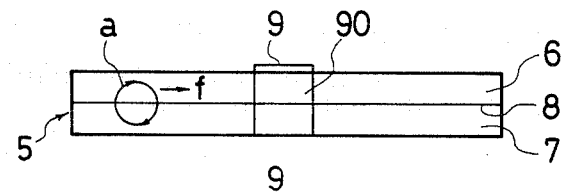
FIGS. 5(A) to (D) are schematic views for explaining the operating principle of the Josephson transmission line device of FIG. 4.

As stated earlier, under specific conditions, a fluxon produced within the transmission line will travel along the line. First, presume that, as shown in FIG. 5(A), a fluxon a of the direction shown by the arrows is generated from an appropriate fluxon generating source at one end of the Josephson transmission line of this embodiment and begins to travel in the direction of the arrow f.

When the fluxon a enters the fluxon stopping position 90, the voltage arising across the inductance components at the stopping position 90 comes to be also applied across the resistance components $r_o$. As a result, the energy of the fluxon is consumed by the resistor component to reduce the energy of movement of the fluxon, whereby the fluxon is prevented from moving beyond the fluxon stopping position 90.

Figure 5B:

As was mentioned earlier, however, a fluxon intrinsically possesses a flux corresponding to a single flux quantum so that it is not annihilated but, as shown in FIG. 5(B), stops at the stopping position 90 where it stays in the form of a vortex current.

Further, in order to allow the fluxon to stop at the stopping position with high efficiency, the thickness of the superconducting layer 6 at the stopping position 90 defined by the resistor element 9 should preferably be at most two times the London penetration depth so as to effectively apply the voltage throughout the resistor element in the lengthwise direction of the transmission line. The provision of the resistor element on the transmission line will be discussed in detail later.

Figure 5C:
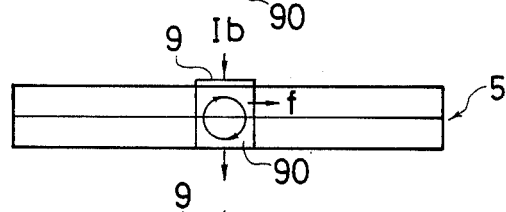

If, however, a stopping position at which a fluxon has come to rest is supplied with a bias or driving current, the fluxon will again begin to propagate. More specifically, as shown in FIG. 5(C), if a driving current $I_b$ is applied in the direction shown in the figure, the fluxon a will, by dint of the Lorentz force it receives from the current $I_b$, again begin to move in the direction indicated by the arrow f.

Figure 5D:
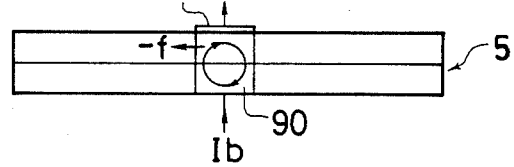

On the other hand, if the driving current is applied in the opposite direction as shown in FIG. 5(D), the fluxon a will begin to travel in the opposite direction indicated by the arrow $-f$. In the case of a fluxon $\bar{a}$ whose current circulates in the reverse direction from that of the fluxon discussed up to this point, the application of the driving current $I_b$ in the directions shown in FIGS. 5(C),(D) will of course cause the fluxon to travel in the opposite direction from that shown in the same figures. In either case, the velocity of the fluxon which is again caused to propagate can be controlled by adjusting the magnitude of the applied bias current or selected driving current.

Like the first embodiment, this second embodiment also overcomes the defects of the prior art devices.

In the embodiments and examples described hereinafter, the fluxon stopping positions 90 can be constituted in accordance with either of the two basic structures described above in connection with the first and second embodiments. Therefore, in the figures schematically showing the embodiments of the invention to be described in the following, the resistor elements 9 will not be shown as such and the fluxon stopping positions formed by the provision of the resistor elements will simply be indicated as hatched regions on the Josephson transmission line. Where an embodiment requires two or more such stopping positions, the first will be denoted by the numeral 90 and the subsequent ones by 91,92,93 . . .

Figure 6:
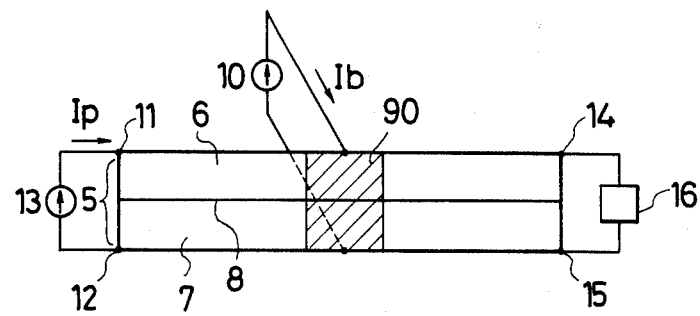
FIG. 6 is a schematic view for explaining the structure of a third embodiment of the invention.

Using the basic device structures shown in FIGS. 2(A) and 4(A) it is possible to realize the application shown in a third embodiment schematically illustrated in FIG. 6. In the device shown in FIG. 6, a current source (fluxon generating source) 13 for producing a current IP is provided between the ends 11, 12 of the transmission line 6, 7 and a current source (fluxon driving source) 10 for producing a bias or driving current $I_b$ is connected across the fluxon stopping position 90 provided with the resistor element 9 (this source being referred to as the fluxon driving source hereinafter). Further, an output circuit 16 is connected across the open ends 14,15 of the transmission line 5 at the other terminus thereof. The purpose of the output circuit 16 is to extract part or all of the energy of a fluxon which passes beyond the stopping position 90 and travels to the opposite terminus of the transmission line or alternatively, to detect the arrival of such a fluxon.

Figure 7:
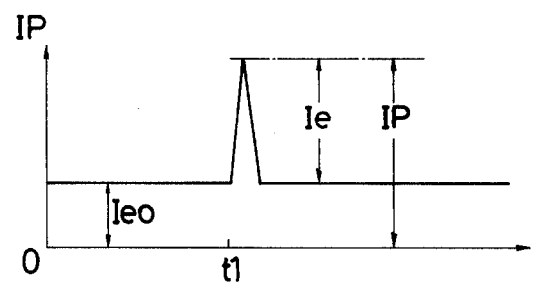
FIG. 7 is a graph for explaining the bias current for fluxon generation in the device shown in FIG. 6.

Although the specific type of fluxon generating source 13 used is beyond the contemplation of this invention, there is illustrated in FIG. 7 by way of example an arrangement that can be applied with particularly high efficiency. Namely, a D.C. bias current $I_{eo}$ is continuously applied until such time as it is necessary to generate a fluxon (indicated as time $t_1$ in the drawing), whereupon there is superimposed on the bias current $I_{eo}$ a current pulse $I_e$ for producing a fluxon.

When this method is used it is preferable for the D.C. component $I_{eo}$ to satisfy the following relationship:

$$I_{eo} < 2\lambda_j w I_o \quad (1)$$

where $\lambda_j$ is the Josephson penetration depth, w the width of the transmission line 5 and $I_o$ the maximum Josephson current density.

Here, of course, if the current pulse $I_e$ can be made adequately large, the D.C. bias current $I_{eo}$ becomes unnecessary.

The output circuit 16 can be an impedance matched circuit of the type capable of detecting the arrival of a fluxon, converting it into a current, voltage or other electrical quantity, and outputting the result of the conversion to an outside circuit, or it can be designed to have such impedance that, as will be explained later, it extracts only a part of the energy of the fluxon.

In the case where it is desired not to reflect a fluxon which has arrived at the far terminus but to supply as close to all of the current corresponding to the fluxon to an outside circuit, it is sufficient to make the resistance component of the circuit 16 about equal to the characteristic impedance $(L/C)^{\frac{1}{2}}$ of the transmission line 5 and hold the inductance component as low as possible.

Figure 8:
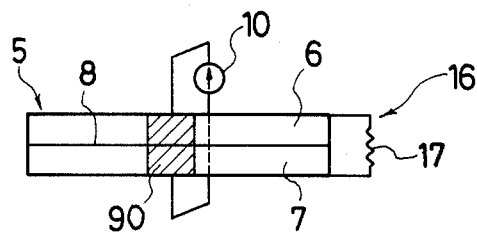
FIG. 8 is a schematic view of the device shown in FIG. 6.
Figure 9:
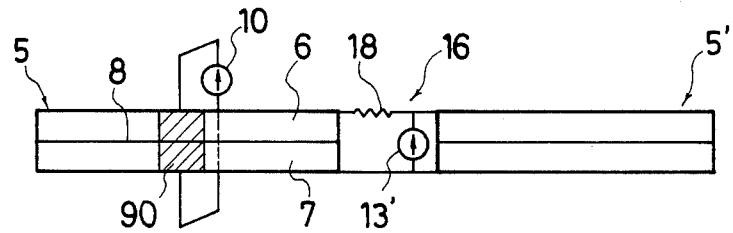
FIG. 9 is a schematic view for explaining a fourth embodiment of the invention.

As shown in FIG. 8, the output circuit 16 can be represented in equivalent form in a simple case as a resistance 17 of a magnitude approximating the transmission line impedance. Alternatively, however, as shown in FIG. 9, it is also possible to connect the output circuit with the input end of a succeeding Josephson transmission line 5', whereby the output therefrom can be input to the succeeding line. In this case, the succeeding transmission line 5' may be one of the structures illustrated in FIGS. 2(A),(B) or FIGS. 4(A),(B), but is not limited to these and may instead be of a conventional structure.

Also, for example as in a fourth embodiment shown in FIG. 9, if the other end of a resistor 18 of the same size as the aforesaid resistor 17 is connected to the input end of the succeeding Josephson transmission line 5' and an auxiliary current source 13' which produces a current that by itself is not large enough to produce a fluxon is connected between the two input ends, it is possible to realize an arrangement wherein fluxons can be selectively generated in the succeeding transmission line 5' since they will be generated only when a fluxon travels to the output end of the Josephson transmission line 5 according to this invention thus causing an output current to pass through the resistor 18 to be superimposed on the auxiliary current.

From the explanation given above, it will be understood that a device using the specific arrangement shown in FIG. 6 or using either of the two basic structures of the present invention can be used as a programmable timer with respect to logic information. More specifically, if the fluxon generating source 13 is considered as a current output of a preceding circuit stage, then by establishing a sequence whereby the fluxon driving source 10 is actuated at given intervals of delay time after inputting to one end of the transmission line the output from said preceding circuit stage in the form of a current representing logic information, it is possible to delay the output of the logic information to the succeeding circuit stage connected to the other end of the transmission line by any length of time desired. Moreover, as was mentioned earlier, it is also possible to control the time required for the fluxon to travel from the stopping position 90 to the output end of the transmission line by adjusting the magnitude of the driving current pulse.

It will also be noted that the device shown in FIG. 8 can be employed as a destructive read-out memory. In this case the following portions of the device are assigned the functions shown below:

Stopping position 90→Data storage
Fluxon generating source 13→Data write
Fluxon driving source 10→Data read command
Output circuit 16→Data read-out
and a fluxon selectively stopped at the stopping position 90 is assigned one of the logic values "1" or "0".

From what was mentioned earlier it is obvious that a destructive read-out memory constituted in this way is by the very nature of its operating principle very low in power dissipation. Moreover, since it is also excellent as regards space factor, it is highly suitable for realizing high density integration.

Before going into an explanation of the application of the invention to devices with various other functions, it will be appropriate at this point to explain practical methods usable for applying a resistor material for formation of the resistor element 9 which is used for stopping fluxons on the transmission line.

In the case of the basic structure shown in FIGS. 2(A),(B), in which the resistor element is applied directly on the edge of the superconducting layer, the resistance value is determined solely by that part of the connecting portion 9b bridging the two superconducting layers which passes across the junction layer 8. On the other hand, since the junction layer 8 is extremely thin, a problem arises in a case where the design requirements call for a resistance value of larger than a given level. In other words, since only a part of the resistor material of a length equal to the thickness of the extremely thin junction layer can be used to provide resistance, it becomes necessary to narrow the width of the resistor element in a case where a large resistance value is required. However, even this expedient may in some cases prove unsatisfactory since there is a limit to how far the width of the resistor element can be decreased.

Figure 10:
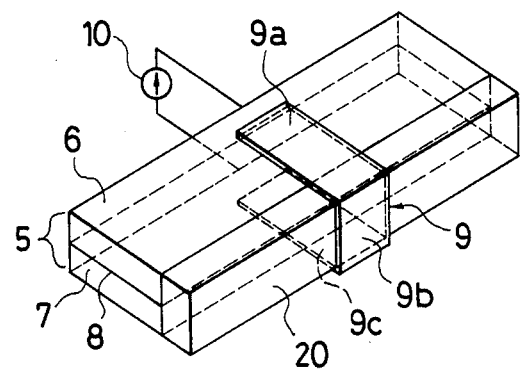
FIG. 10 is a schematic view for explaining a fifth embodiment of the invention.
Figure 11:
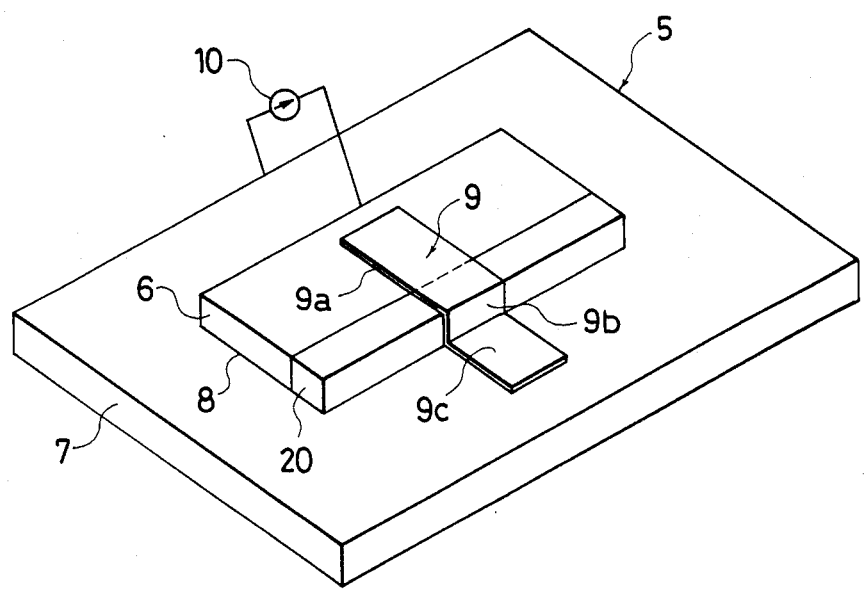
FIG. 11 is a schematic view for explaining a sixth embodiment of the invention.

In such situations, the difficulty can be overcome by the means used in a fifth embodiment of the invention illustrated in FIG. 10, namely by providing an insulating layer 20 formed of an appropriate material along the side edge of the transmission line 5 on which the connecting portion is provided. As this method makes it possible to take advantage of a length equal to the exposed periphery of the insulating layer 20 for provision of the effective portion of the resistor element 9, it becomes possible to provide whatever resistance value is dictated by the design requirements without narrowing the width of the resistor element 9, and, moreover to provide it with high repeatability. In the actual fabrication of such a device, it is convenient to provide the insulating layer 20 on a structure of the type shown in FIG. 1(C) wherein the lower superconducting layer 7 is formed to have a larger area than the upper superconducting layer 6. This is the arrangement employed in a sixth embodiment of the invention illustrated in FIG. 11, wherein the resistor element portions 9a,9c disposed respectively on the upper and lower superconducting layers are connected by the connecting portion 9b.

Figure 12:
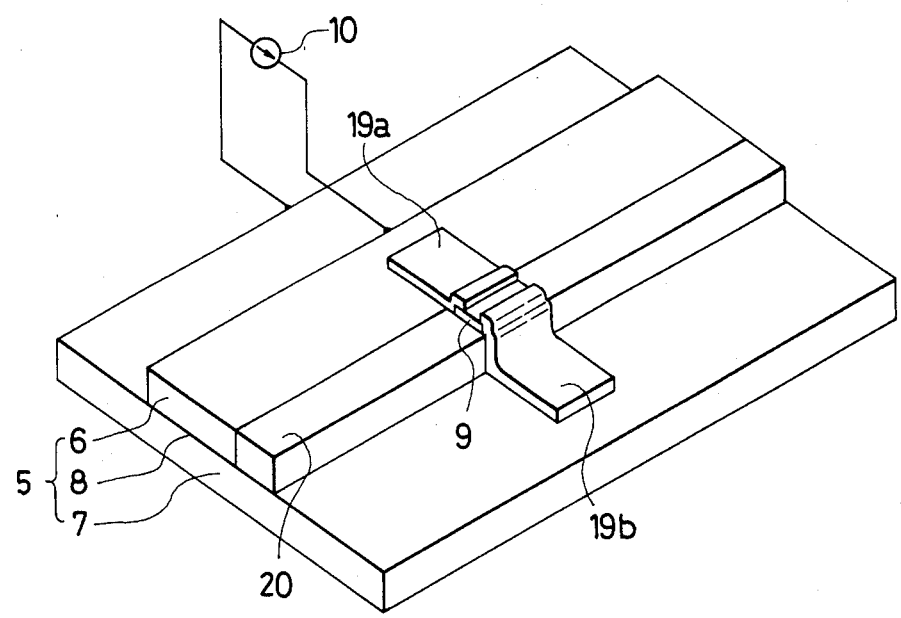
FIG. 12 is a schematic view for explaining a seventh embodiment of the invention

Another solution to the same problem is shown in a seventh embodiment illustrated in FIG. 12. Here the resistor element 9 is provided only on the upper surface of the insulating layer 20 and is connected to the superconducting layers 6,7 by connectors 19a,19b formed of superconducting material. The use of this arrangement provides greater freedom in the formation of the thin film resistor element 9, which is normally subject to severe conditions as regards thickness, width etc. It should, also be noted that the arrangement shown in FIG. 12 using the resistor element 9 and the connectors 19a,19b can also be applied to the configuration shown in FIG. 10.

In the case of the basic structure shown in FIGS. 4(A),(B) wherein the resistor element 9 is provided on one of the two superconducting layers, the film thickness of the superconducting layer concerned may, under certain conditions, be subject to some degree of limitation based on the London penetration depth.

Figure 13:
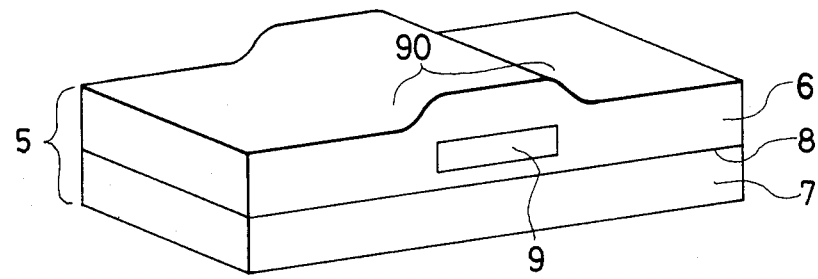
FIG. 13 is a schematic view for explaining an eighth embodiment of the invention.

One way of avoiding this limitation is that used in an eighth embodiment of the invention illustrated in FIG. 13, wherein the resistor element 9 is embedded within the superconducting layer 6. This arrangement can of course also be used even when the superconducting layer is not subject to any particular limitation in order to bring the resistor element into closer proximity to the junction layer and thus enhance the fluxon arresting performance of the stopping position 90

Figure 14:
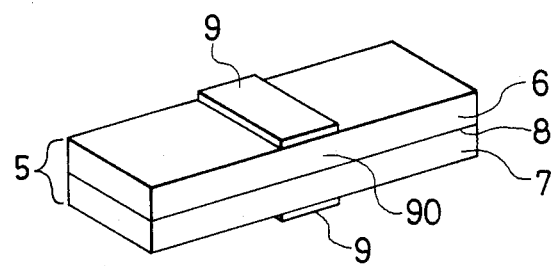
FIG. 14 is a schematic view for explaining a ninth embodiment of the invention.

Again, as shown in a ninth embodiment illustrated in FIG. 14, a separate resistor element 9 can be provided on each of the superconducting layers 6,7. In this case, the provision of one or both of the resistor elements may be made in accordance with the arrangement of FIG. 13.

As shown in each of the embodiments described in the foregoing, it is not necessary for the driving source 10 which supplies driving current to the stopping position 90 to supply this driving current through the resistor element 9, and it is sufficient for the driving source to be instead directly connected to the superconducting layers at the part of the transmission line where the resistor element is disposed.

The considerations mentioned above also apply to the embodiments to be described in the following, and for simplicity, the insulating layer 20 will not be shown in the drawings even when it is provided.

By way of example, the results of tests conducted using the seventh embodiment of the invention shown in FIG. 12 will now be discussed.

Figure 15A:
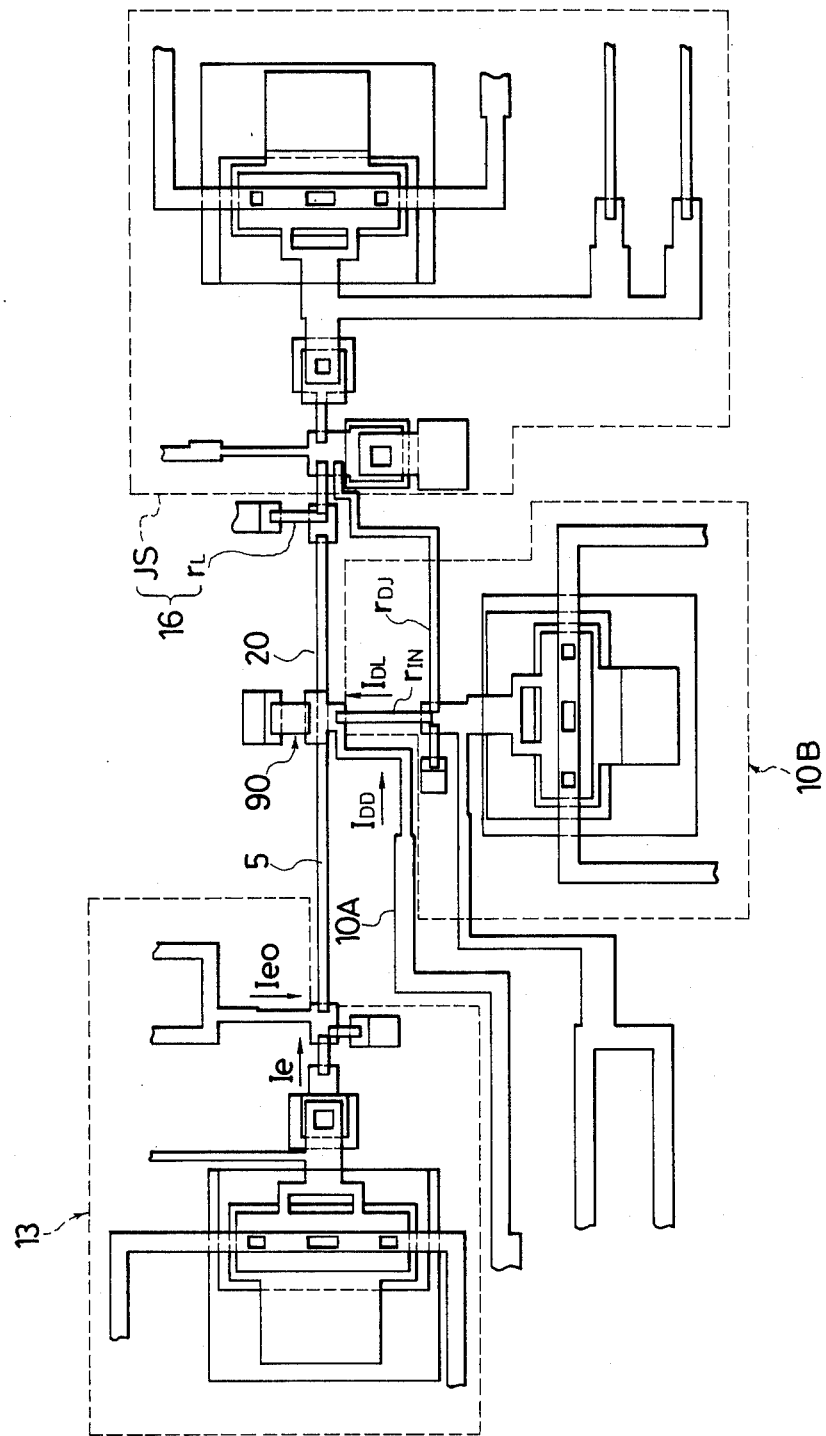
FIGS. 15(A) to (C) are a circuit layout, an equivalent circuit and current characteristic curves relating to the sixth embodiment of the invention.
Figure 15B:
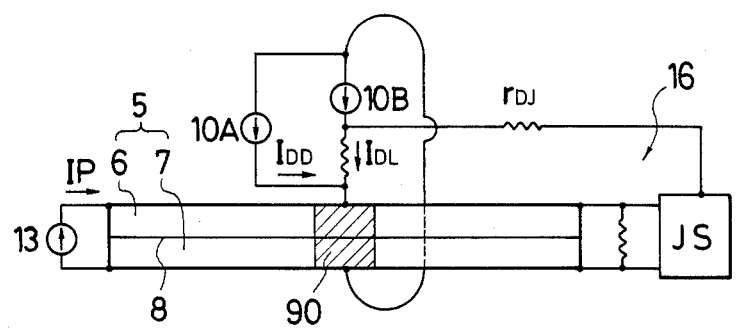

FIG. 15(A) shows a circuit layout of a sample device fabricated employing the present invention and FIG. 15(B) is an equivalent circuit of the same. NbN was used for the superconducting layers 6,7, and the junction layer 8 was formed of a thin film of niobium oxide (NbO). The Josephson transmission line 5 was 120 $\mu$m long and 2.5 $\mu$m wide. The resistor element 9 was formed of film of Au-In alloy and measured 8 $\mu$m in the lengthwise direction of the transmission line and 6 $\mu$m in the direction normal thereto. The insulating layer (denoted by reference numeral 20 in FIG. 12) was formed of SiO. The fluxon generating source 13 was arranged so as to generate one fluxon for each supply to the transmission line 5 of a current pulse IP formed by superimposing a pulse current $I_e$ on a D.C. current $I_{eo}$ as shown in FIG. 7. The device was provided with two fluxon driving sources 10, which are denoted in FIG. 15(B) as 10A and 10B. The driving source 10A was designed to supply a D.C. current $I_{DD}$ and the driving source 10B to supply a step pulse current $I_{DL}$. As the output circuit 16 there was used a matching resistor and a Josephson sampler connected in parallel therewith. In order to observe the time relation between the step pulse and the fluxon read-out, the driving source 10B was connected to the Josephson sampler JS via a resistor $r_{DJ}$.

Figure 15C:
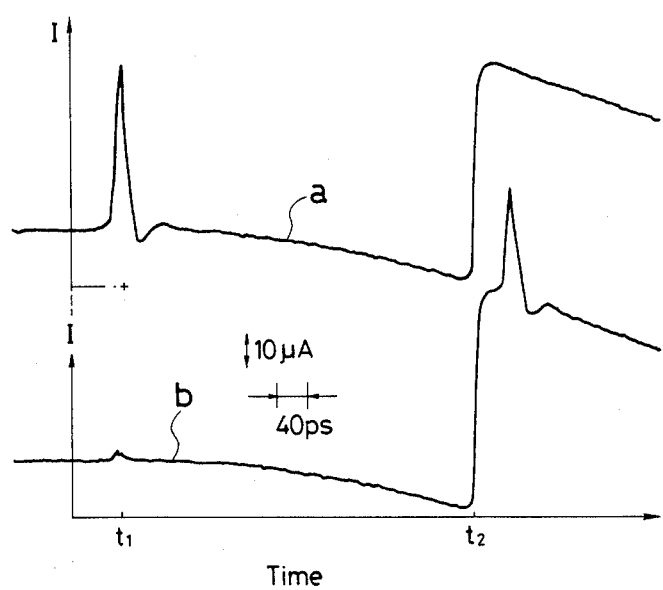

The test results obtained using the Josephson sampling method are shown in FIG. 15(C). The characteristic curve a in FIG. 15(C) shows the results of the operation when the level of the current $I_{DD}$ supplied by the driving source 10A was 0.20 mA. In the curve a, the pulse seen at time $t_1$ was caused by the arrival at the Josephson sampler of a fluxon which was not stopped by the fluxon stopping position 90 formed by the provision of the resistor element 9. In this case, as the current $I_{DD}$ was applied in advance, the fluxon generated at the end of the transmission line connected to the fluxon generating source 13 did not stop at the stopping position 90. On the other hand, the step pulse seen in the characteristic curve a at $t_2$ is caused by the current flowing into the Josephson sampler JS from the driving source 10B through the resistor $r_{DJ}$. This means that the step pulse current $I_{DL}$ is applied to the stopping position 90 at exactly the same instant. In this case, since no fluxon is stopped at the stopping position 90, no fluxon signal appears simultaneously with this step pulse current.

The characteristic curve b in FIG. 15(C) shows the results of the operation when no d.c. current is applied by the driving source 10A ($I_{DD}$=0). No fluxon signal appears at $t_1$. At $t_2$, however, a single fluxon signal is observed to appear simultaneously with the step pulse current $I_{DL}$. This shows that a fluxon generated at one end of the transmission line 5 was once stopped at the stopping position 90 and then was caused to resume its travel upon the application of the step pulse current $I_{DL}$.

When driving current is applied beforehand, the fluxon passes through the fluxon stopping position constituted by the resistor region without stopping. In contrast, when the driving current is not applied, the fluxon stops at the stopping position and, after it has stopped, can then be made to resume its travel by the application of driving current. These test results show that the basic structures described above and the embodiments employing these structures can be expected to operate properly in the manner described.

Additional embodiments of the invention based on the above-mentioned structures will now be described.

Figure 16:
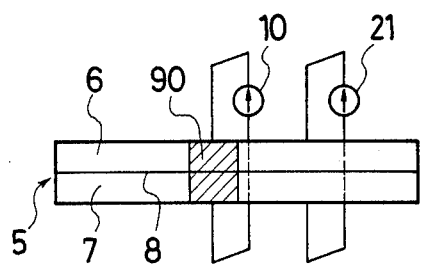
FIG. 16 is a schematic view for explaining a tenth embodiment of the invention.

In the tenth embodiment of the invention shown in FIG. 16, an auxiliary fluxon driving source 21 is provided between the fluxon stopping position 90 and the output end of the fluxon transmission line 5. The provision of the auxiliary driving source 21 enables adjustment of the fluxon velocity, which is convenient where, for example, it is necessary to carry out time delay adjustment within a very narrow time frame or to make a fine synchronization adjustment. If necessary, it is of course also possible to provide a similar fluxon driving source between the input end and the stopping position 90.

Figure 17:
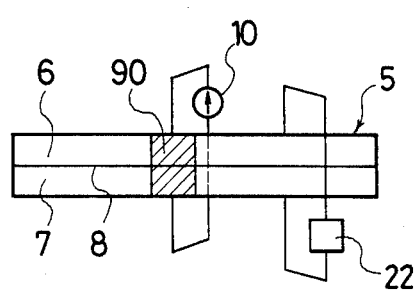
FIG. 17 is a schematic view for explaining an eleventh embodiment of the invention.

In an eleventh embodiment shown in FIG. 17, a second output circuit 22 of the same structure as that of the output circuit 16 described earlier is provided prior to the output end of the transmission line 5 for use in extracting a part of the vortex current of the propagating fluxons.

In this case, however, it is necessary to make some provision regarding impedance so as not to greatly modify the fluxons themselves. Thus it is preferable to make the resistance component of the impedance of the branch output circuit 22 two, three or more times greater than the characteristic impedance $(L/C)^{\frac{1}{2}}$ of the transmission line 5.

Figure 18:
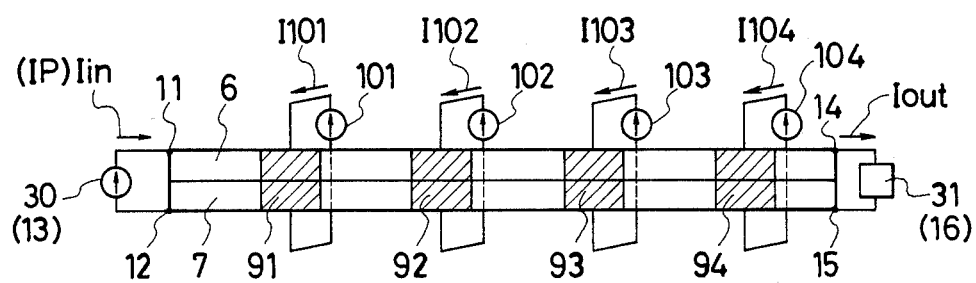
FIG. 18 is a schematic view for explaining a twelfth embodiment of the invention.

A twelfth embodiment illustrated in FIG. 18 employs the structure of the third embodiment of FIG. 6 but is provided with a plurality of stopping positions 91, 92, 93 ... 9n (n=4 in the illustrated example) so that functionally it constitutes a series-in, series-out shift register.

In this device, the fluxon generating source 13, which is a current source of the type already generally described, can be considered to constitute a logic signal source 30. In other words, the current IP for generating fluxons can be considered to be a logic signal $I_{in}$ taking the form of a current. For the sake of simplicity, the state when a logic signal is input as a flowing current is defined as "1" and the state when no current flows as "0".

To the stopping positions 91,92,93,94 are respectively connected current sources 101,102,103,104 (each corresponding to a fluxon driving source 10 described earlier) which in this device function as clock current sources for shift operation.

Figure 19:
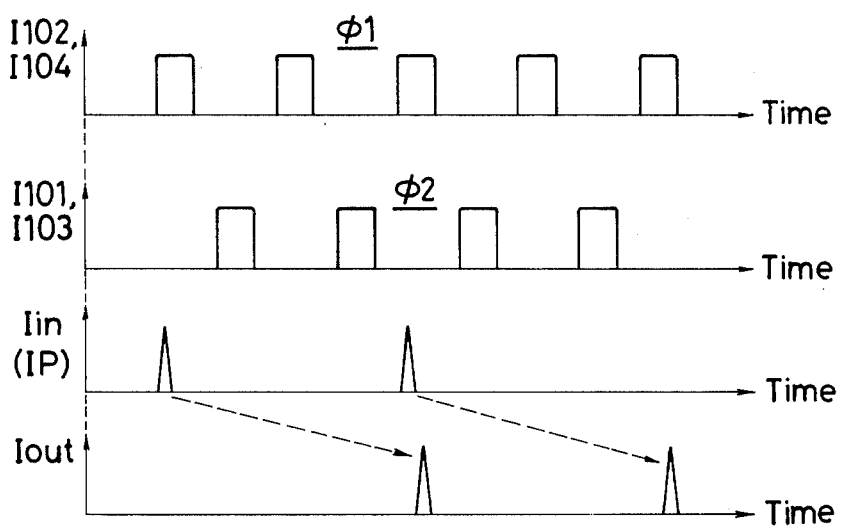
FIG. 19 is a time chart for explaining the operation of the device shown in FIG. 18.

Considering the operation of the device with reference to one example of a time chart shown in FIG. 19, the current sources 102,104 associated with the even-numbered stopping positions as reckoned from the input end of the transmission line (the stopping positions 92,94 in the illustrated example) constitute a first phase clock $\Phi 1$ which supplies clock pulses $I_{102}$, $I_{104}$ to said even-numbered stopping positions. On the other hand, the current sources 101,103 associated with the odd-numbered stopping positions (i.e. the stopping positions 91,93) constitute a second phase clock $\Phi 2$ which supplies clock pulses $I_{101}$,$I_{103}$ to said odd-numbered stopping positions. The first and second phase clock pulses differ in phase by 180°.

Assuming that a logic signal "1" is issued from the logic signal source 30 and that at least at about the same time as, i.e. in general synchronization with, the issuance of the logic signal the first phase clock pulses $I_{102}$, $I_{104}$ are supplied to the associated stopping positions 92, 94, then the fluxon generated at the input end of the transmission line will travel to and stop at the first fluxon stopping position 91, which is not being supplied with a clock pulse.

If after this state is reached, the first phase clock pulses fall and the second phase clock pulses rise, the pulse $I_{101}$ supplied to the fluxon stopping position 91 will cause the fluxon stopped at this position to resume its travel, whereafter it will move on to and stop at the second stopping position 92, which at this time is not being supplied with a clock pulse.

Then when the second phase clock pulses rise and the first phase clock pulses fall, the fluxon that was stopped at the stopping position 92 will, by the same mechanism, move on to the third stopping position 93 and stop there.

With the succeeding clock inversion the fluxon will proceed to the fourth stopping position 94 and then with the following inversion will be output to and detected by a detector 31 of the same preferred structure as that of the output circuit 16 described above.

From what has been said up to this point, it is clear that the device illustrated in FIG. 18 is generally capable of carrying out the functions of an n-bit shift register.

Although the foregoing description was made with respect to two-phase clock operation, it will be understood that by proper selection of the waveform of the clock pulses and the duration of these pulses, the same operation can also be realized with a single-phase clock.

Figure 20:
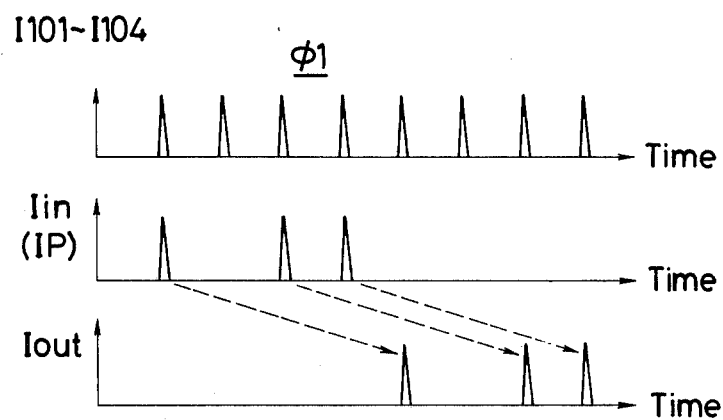
FIG. 20 is a time chart in the case of operating the device shown in FIG. 18 as a single-phase clock.

For example, if as shown in FIG. 20 the waveform of the clock pulses is made fairly impulse-like, the intended purpose can be realized even if the clock pulses are applied to the stopping positions 91,92,92...,94 simultaneously. More specifically, it is sufficient if the waveform employed is such that by the time a fluxon set into motion by the rising edge of a clock pulse has reached the next stopping position, the clock pulse concerned has fully fallen. That is to say it is sufficient to use a clock pulse with a pulse width which is shorter than the time required for the fluxons to travel between neighboring stopping positions. Such extremely sharp and high-speed current pulses can be produced by such already known devices as the Josephson pulse generator or the like.

Figure 21:
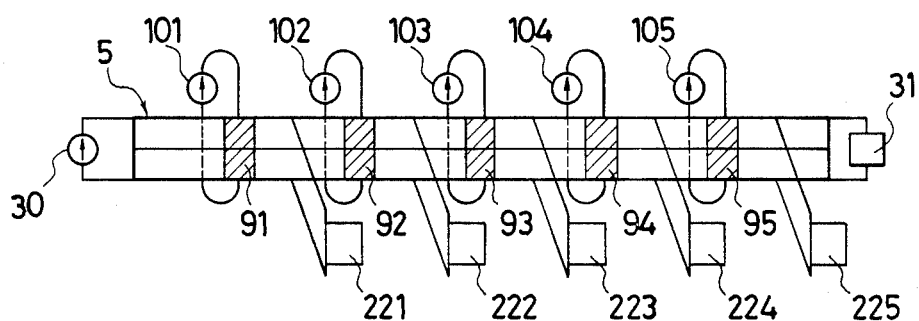
FIG. 21 is a schematic view for explaining a thirteenth embodiment of the invention.

Addition of the branch output circuit of the tenth embodiment shown in FIG. 16 to the device structure shown in FIG. 18 results in a series-in, series-parallel-out shift register, as in a thirteenth embodiment of the invention shown in FIG. 21.

In the 5-bit register illustrated in FIG. 21, each of the fluxon stopping positions 91,92...,95 is followed by a branch output circuit 221,222,...,225 so that the binary data at the respective positions is read out in parallel at the respective clock timings.

Figure 22:
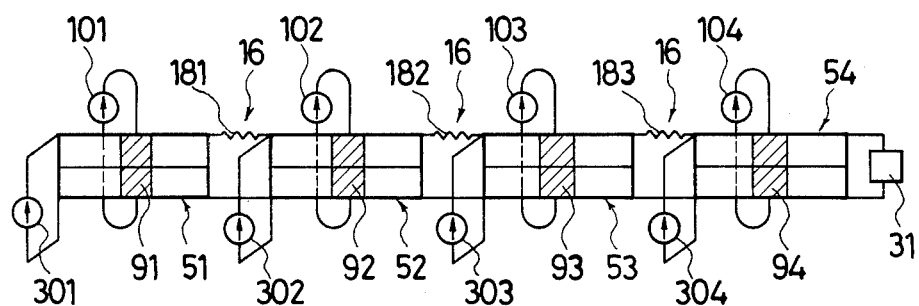
FIG. 22 is a schematic view for explaining a fourteenth embodiment of the invention.

A fourteenth embodiment of the invention constituting a parallel-in, series-out register is shown in FIG. 22. In the illustrated example, four Josephson transmission lines each provided with one stopping position are connected by resistors 181,182,183 in the manner shown in FIG. 9 and to the input ends of the respective transmission line segments there are connected logic signal sources 301,302,303,304 for parallel input. With the arrangement, a group of logic signals input in parallel altogether at a given timing can then be shifted in accordance with the succeeding clock sequence.

With the further incorporation into this structure of the structure explained above in connection with FIG. 21, there can be obtained a parallel-series-in and out shift register.

Figure 23:
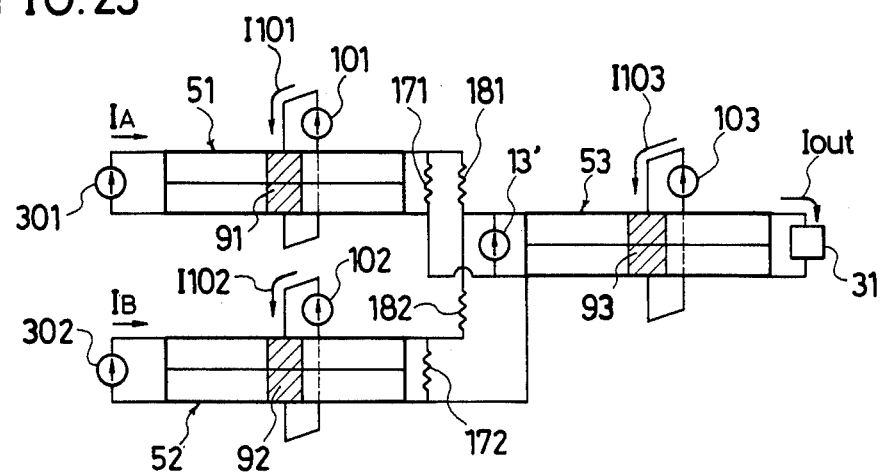
FIG. 23 is a schematic view for explaining a fifteenth embodiment of the invention.

Construction of an AND gate employing the basic structures shown in FIGS. 2(A),(B) and FIGS. 4(A),(B) will now be considered. For the sake of simplicity the explanation will be made with respect to a two-input AND gate of the structure used in a fifteenth embodiment illustrated in FIG. 23. The device comprises three basic structures 51,52,53, two of which (51,52) constitute input side Josephson transmission lines having logic signal sources 301,302 connected to their respective input ends, and the third of which consitutes an ouput side Josephson transmission line having a logic signal detector connected to its output end. In the manner of the structure shown in FIG. 6, the three transmission lines are respectively provided with stopping positions 91,92,93 which, in turn, are respectively provided with current sources 101,102,103 for supplying driving currents $I_{101}, I_{102}, I_{103}$ for selectively driving the fluxons.

Further, terminating resistors 171,172 are connected across the output ends of the input side transmission lines 51,52, respectively, so as to dissipate a part of the output currents at these points, while addition resistors 181,182 are provided to add the remainder of the output currents and forward the sum to the input of the output side transmission line 53.

Figure 24:
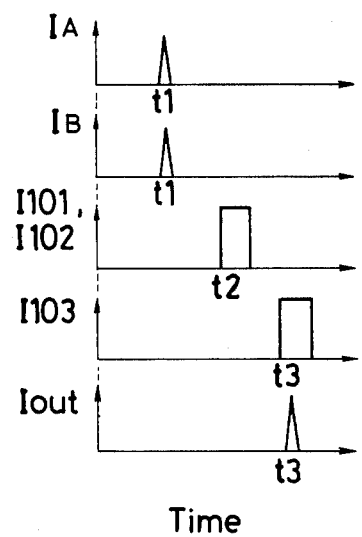
FIG. 24 is a time chart for operating the device shown in FIG. 23 as a logic AND device.

The logic AND operation of this fifteenth embodiment will now be explained with reference to the time chart shown in FIG. 24.

The state in which the input currents $I_A$, $I_B$ are applied will be defined as "1", and the operation of the device will be examined to see whether it carries out the calculation "$1 \times 1 = 1$".

If at the time $t_1$ the input logic signals are both "1", a fluxon will be generated in both of the corresponding input side Josephson transmission lines and these fluxons will travel to and stop at the stopping positions 91, 92.

Then, if as shown at time $t_2$, fluxon driving currents $I_{101}, I_{102}$ are supplied to the respective input side transmission lines by the current sources 101,102, the fluxons which have once come to rest will simultaneously resume their travel, whereby at virtually the same instant they will arrive at the output ends of the input side transmission lines and a part thereof will be applied to the input end of the output side transmission line 53 via the addition resistors 181,182 in an added or superimposed manner.

As a result, a fluxon will be generated at the input end of the output side transmission line 53 and travel to and stop at the stopping position 93.

Then at time $t_3$ when a driving current pulse $I_{103}$ is supplied to the stopping position 93 from the associated current source 103, the logic information-bearing fluxon stopped at this position will begin to move toward the output end of the transmission line and eventually be detected by the detector 31 as an output current $I_{out}$ representing the result of the arithmetic operation, namely the product "1".

The fact that the device outputs the product "1" when the value "1" is applied to both input terminals is of course necessary but not sufficient to show that it is capable of operating as an AND gate. It is also necessary to show that no output current flows when "1" is applied to only one of the input terminals; !hat is, it must be shown that it is capable of carrying out the operation $1 \times 0 = 0$.

From the operation described above, however, it will be easily understood that the device can be made to operate in this manner merely by properly selecting the values of the terminating resistors 171,172 and the addition resistors 181,182, that is by properly setting the current division ratio of the outputs from the respective input side transmission lines so that a fluxon will not be generated at the input end of the output transmission line 53 solely by the application of the current output by only one of the input side transmission lines. Also, it should be noted that the device according to this embodiment can, if required, be provided with an auxiliary current source 13' for supplying an appropriate D.C. bias current to the input end of the output side transmission line, similarly to what was described in conjunction with FIG. 9.

It is obvious that a device of the above-described arrangement is capable of carrying out the operation $0 \times 0 = 0$, the only remaining requirement to be satisfied by an AND gate.

It is also possible to develop the illustrated two-input type device into an n-input type device. Further, by eliminating the terminating resistors 171,172 and either selecting the values of the addition resistors for impedance matching or appropriately setting the current division ratio, thus enabling generation of a fluxon by the output current from only one of the input side transmission lines, it is possible to use the device as an OR gate.

Figure 25:
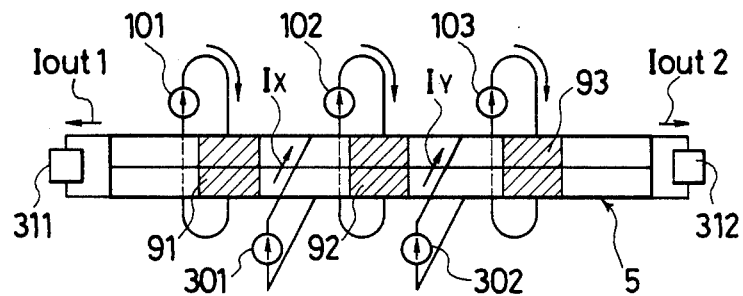
FIG. 25 is a schematic view for explaining a sixteenth embodiment of the invention.

On the other hand, an arrangement specially designed for use as an OR gate is illustrated in FIG. 25 as a sixteenth embodiment of the invention. For simplicity of explanation, the device is shown as having only two input terminals.

The illustrated OR gate device comprises a Josephson transmission line 5 having three fluxon stopping positions 91,92,93 disposed at equal intervals in its lengthwise direction and connected respectively with current sources 101,102,103 for selectively supplying fluxon driving current pulses. To the opposite ends of the transmission line 5 are connected detectors 311,312 for detecting the result of the OR operation.

The input current signals will be defined as $I_X, I_Y$ and the state in which these are applied as binary "1". The input current signal $I_X$ is applied to the transmission line 5 between the stopping positions 91 and 92 by a signal generating source 301 and the current signal $I_Y$ is applied between the stopping positions 92 and 93 by a signal generating source 302.

Figure 26A:
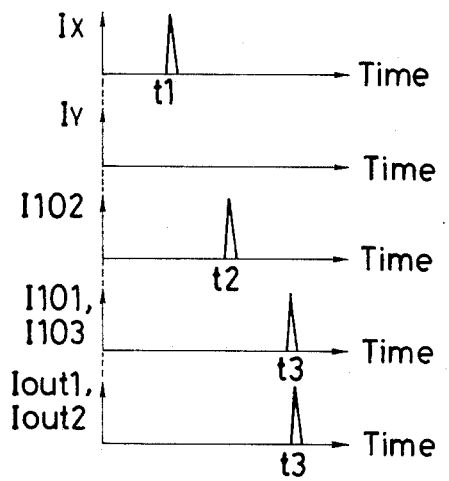
FIGS. 26 (A) to (C) are a time chart for operation of the device shown in FIG. 25 and explanatory views for describing the operation of the same device.
FIGS. 26(D) to (F) illustrate another time chart for operation of the device shown in FIG. 25, as well as explanatory views for describing another operation of the same device.

Consideration will first be given to the case where, in the above-described arrangement, the inputs from the signal sources 301,302 are, as shown in FIG. 26(A), $I_X = 1$ and $I_Y = 0$ at time $t_1$.

In this case, since fluxon generating current is applied to the Josephson transmission line 5 only between the fluxon stopping positions 91,92 by the signal source 301, fluxons will be generated only in this region. However, since the point of generation lies midway of the transmission line 5, the fluxons will always be generated in pairs having oppositely circulating vortex currents and the two fluxons of the pair will propagate in opposite directions.

Figure 26B:
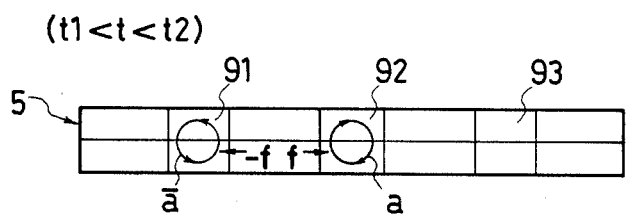

In other words, as shown in FIG. 26(B), two fluxons with oppositely circulating vortex currents, which will be denoted as fluxon a and fluxon ā, are generated. The fluxon a travels in the direction of the arrow f and stops at the center stopping position 92, while the fluxon ā travels in the direction of the arrow −f and stops at the leftmost stopping position 91.

Figure 26C:
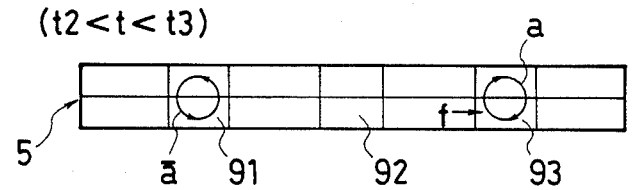

Next, if at time $t_2$ a current pulse $I_{102}$ is selectively supplied to only the central stopping position 92 by the current source 102, only the fluxon a stopped at the stopping position 92 will be caused to travel further in the direction f and come to rest at the rightmost stopping position 93, as shown in FIG. 26(C).

If in this state, driving current pulses $I_{101}$, $I_{103}$ are supplied to the endmost stopping positions 91,93 by the current sources 101,103 at time $t_3$, the fluxons a, ā stopped at these positions will move out of the positions and travel in opposite directions, eventually being output to the detectors 311,312 as output currents $I_{out1}$, $I_{out2}$, each of which represents the binary bit "1".

From this it will be seen that the relationship $1 + 0 = 1$ of an OR logic operation is satisfied.

Figure 26D:
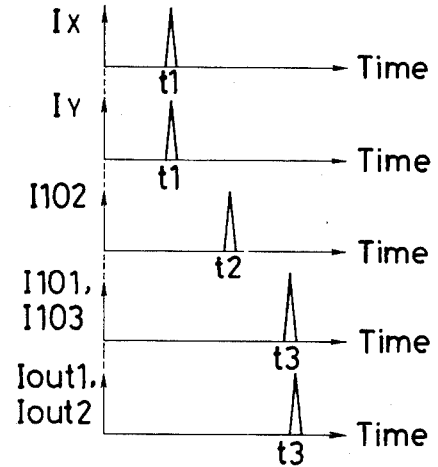
Figure 26E:
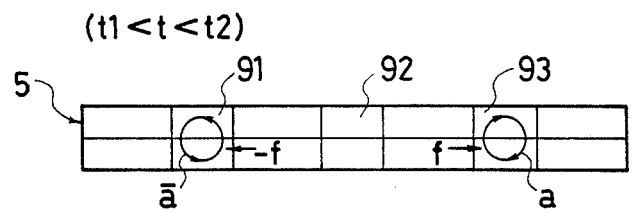
Figure 26F:
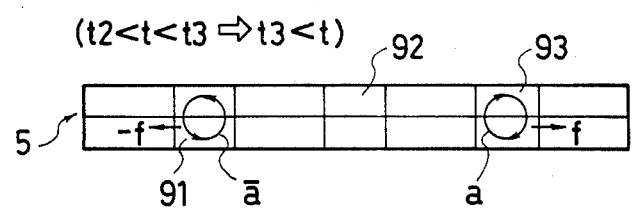

Next, an explanation will be given of the case where, as shown in FIGS. 26(D) to (F), the driving pulse sequence is the same but the input signals represented by the input currents $I_X, I_Y$ are both "1".

In this case, the signal sources 301,302 input fluxon generating current on either side of the stopping position 92 causing two pairs of oppositely circulating fluxons to be generated and the members of each pair propagate in opposite directions from each other. The rightwardly traveling fluxon a generated by the signal source 301 meets the leftwardly traveling fluxon ā generated by the signal source 302 at the central stopping position 92, where the two fluxons annihilate each other. On the other hand, the two remaining fluxons ā,a travel to and stop at the stopping positions 91,93 at the opposite ends of the transmission line 5.

In this state no change will occur even if a driving current pulse $I_{101}$ is applied to the center stopping position 92 at time $t_2$.

Then, if at the time $t_3$, driving current pulses $I_{101}, I_{103}$ are supplied to the stopping positions 91,93 by the associated driving sources 101,103, the fluxon ā at the stopping position 91 will begin traveling in the direction indicated by the arrow −f to be output to an output circuit or the detector 311 at the left end of the transmission line, while the fluxon a at the stopping position 93 will begin traveling in the direction indicated by the arrow f to be output to the detector 312 at the right end of the transmission line. (See FIG. 26(F)).

As a result, as is obvious from the fact that both $I_{out1}$ and $I_{out2}$ are output, the OR operation relationship $1 + 1 = 1$ is satisfied at the detectors or output circuits 311,312.

In the case where both input signals are "0", that is when both the input signal currents $I_X, I_Y$ are "0", it is obvious that both logic outputs are zero since no output current flows at either end of the transmission line, meaning that the device satisfies the OR operation $0 + 0 = 0$.

As another digital device to which the invention can be applied, there will now be described as a seventeenth embodiment of the invention a frequency divider illustrated in FIG. 27.

Purely in terms of structure, this embodiment is the equivalent of one of the basic structures illustrated in FIGS. 2(A),(B) or FIGS. 4(A),(B), plus the current sources, and output circuit or detector of FIG. 6, and the aforesaid function of a frequency divider is realized by appropriate selection of the impedance relationship which determines the matching between the said output circuit and the Josephson transmission line.

The input digital signal $I_{in}$ to be frequency divided can be represented as corresponding to the current $I_{10}$ from the driving source 10 used in the embodiments described above for selectively driving fluxons stopped at the stopping position. In the present device, as in the most basic embodiment shown in FIG. 6, the current IP from the fluxon generating source 13 provided at one end of the Josephson transmission line 5 is used only at the initial stage of operation to generate a single fluxon.

Differently from the previous embodiment, however, the output circuit 16 or detector 31 provided at the other end of the transmission line is designed to have such a high impedance that this end can be maintained in an almost open state. In other words, the resistance component of the input impedance of the detector 31 is set to be adequately large as compared with the impedance of the transmission line $(L/C)^{\frac{1}{2}}$.

The operation of this seventeenth embodiment of the invention will now be explained with reference to the time chart shown in FIG. 28(A). First, as shown at time $t_o$ in FIG. 28(A), at the initial stage of operation the transmission line 5 is supplied with fluxon generating current IP from the fluxon generating source 13, thus causing a fluxon to be produced in the transmission line 5.

As explained above, this fluxon travels along the transmission line until it reaches the stopping position 90 where it stops and waits. Being a clockwise circulating fluxon as shown in FIG. 28(B), it is designated as fluxon a.

Now if at time $t_1$, the first bit of an input digital current signal $I_{in}$ is applied to the stopping position 90, the fluxon waiting there will begin to travel along the transmission line 5 in the direction of the arrow f, i.e. toward the opposite end of the line.

As was touched on briefly earlier, however, if said other end of the transmission line 5 should be open, the fluxon would be reflected upon reaching this end of the line and return in the opposite direction as a fluxon circulating in the opposite (counterclockwise) direction. The device according to this embodiment utilizes this phenomenon. More specifically, since the input impedance of the detector 31 or output circuit 16 is, as mentioned above, set high, only a small part of a fluxon which travels to the other end of the transmission line 5 is extracted as output current $I_{out}$ flowing into the detector 31, and the major portion thereof which remains is reflected in the opposite direction as an oppositely circulating fluxon $\bar{a}$, which travels back to the stopping position 90 where it stops and waits. This state is shown in FIG. 28(C).

Thus a part of the fluxon moved by the first input signal pulse is output to and detected by the detector 31 as output current pulse $I_{out}$. Next, when the second input signal current pulse is applied to the stopping position 90 after the lapse of a time $\Delta t$ whose length corresponds to the frequency of the input signal, the fluxon waiting at the stopping position 90 will not be caused to travel toward the output end of the transmission line since, as shown in FIG. 28(C), it is a reversely circulating fluxon $\bar{a}$, but will be caused to travel in the direction of the arrow $-f$ toward the end of the transmission line 5 connected to the fluxon generating source 13, where it will be reflected and then return to and stop at the stopping position 90. Consequently, the second input signal current pulse is not detected by the detector 31.

Here it should be noted, however, that the fluxon which traveled to and was reflected by the fluxon generating end of the transmission line 5 as a result of the application of the second input pulse will have again had its circulating direction reversed so that the situation is once more the same as that shown in FIG. 28(B). Therefore, when the third pulse is applied after the lapse of another time interval $\Delta t$, the fluxon will once more travel to the output end of the transmission line 5 and be detected by the detector 31 as an output current pulse $I_{out}$.

Figure 28A:
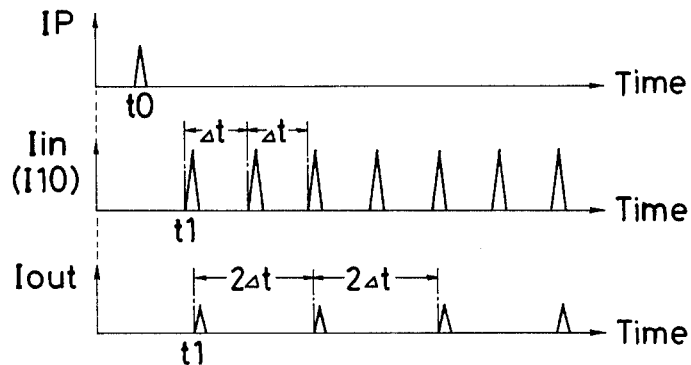
FIGS. 28 (A) to (C) are a time chart for operation of the device shown in FIG. 27 and explanatory views for describing the operation of the same.
Figure 28B:
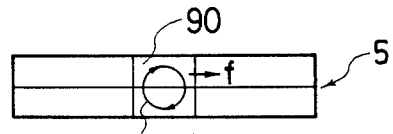
Figure 28C:
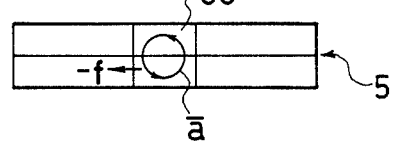

Thereafter, by the same mechanism, the states shown in FIGS. 28(A) to (C) will alternate repeatedly, meaning that the period of the output current signal will in this case be $2\Delta t$ or that the frequency of the input signal will be divided in half. Here it should be noted that larger frequency division factors can be realized by providing a plurality of appropriately spaced stopping positions 90 and applying the pulses of an input signal of a given frequency to these stopping positions as driving currents.

Figure 27:
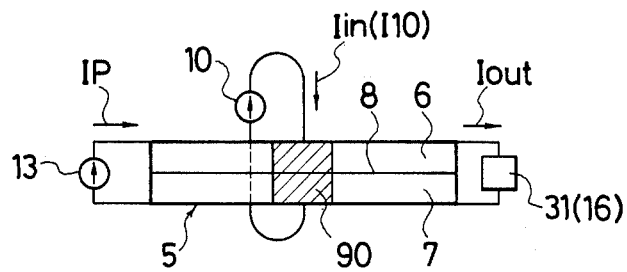
FIG. 27 is a schematic view for explaining a seventeenth embodiment of the invention.

Moreover, it is also possible to operate the embodiment shown in FIG. 27 as a nondestructive read-out memory device.

More specifically, for such operation it is sufficient to consider the driving current source 10 connected to the stopping position 90 for selective supply of fluxon driving current to be a current source for read command and to consider the fluxon generating source 13 to be an input logic signal source. By way of example, one mode of operation of such a device will now be explained with respect to the time chart shown in FIG. 29. Assuming that a fluxon generated in the transmission line 5 by the fluxon generating source 13 represents the binary value "1", once such a fluxon has been generated it will remain stationary at the stopping position 90 until a read command has been applied. This state is the same as that shown in FIG. 28(B) discussed earlier.

Figure 29A:
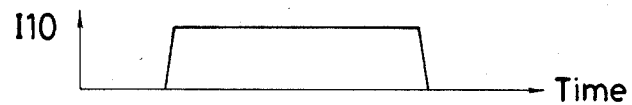
FIGS. 29(A) and (B) are time charts for the case of operating the device shown in FIG. 27 as a nondestructive memory.
Figure 29B:
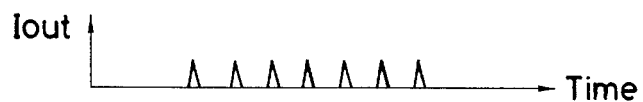

Now if as shown in FIG. 29(A) a read command current $I_{10}$ of a desired time duration is applied by the read command current source 10, the fluxon will, as described earlier, alternate repeatedly between the states shown in FIGS. 28(B) and (C) so long as the current continues to be applied, whereby, as shown in FIG. 29(B), a signal $I_{out}$ having a fixed period will appear in the detector 31.

On the other hand, when there is no fluxon corresponding to binary "1" on the transmission line, i.e. when binary "0" is carried on the transmission line, the application of the command current $I_{10}$ cannot possibly cause a fluxon to travel so that there will naturally be no output current $I_{out}$.

Thus, when the device of FIG. 27 is used in this way, binary "1" is detected as a signal of a specific frequency, while binary "0" is detected as the absence of output current As a result, it is very easy to discriminate between the two states. Moreover, it will be clear from the principle of operation described earlier, that the fluxon is not annihilated by the read operation so that a fluxon will still be present on the transmission line even after the operation of reading binary "1" has been completed (also after the reading current $I_{10}$ falls). This means that the device operates as a nondestructive read-out memory device.

Further, using entirely the same structure, the device shown in FIG. 27 can also be made to operate as a pulse generator with on/off control input terminals. More specifically, this type of operation can be realized by considering the current source 10 connected to the stopping position 90 to be a pulse generation command source, operating the fluxon generation source 13 in advance to produce a fluxon on the transmission line 5, causing the command source 10 to supply pulse generation command current to the stopping position 90 so long as it is desired to produce pulses, and stopping the supply of pulse generation command current when the generation of pulses is to be discontinued.

Also, if the resistor element 9 is applied continuously over all or a relatively large part of the total length of the transmission line, it becomes possible to control the traveling velocity of the fluxon, enabling use of the device as a passive signal delaying transmission line.

The embodiments described up to this point relate particularly to devices capable of various digital functions which carry out logical operations using clock pulses. However, in the above-described Josephson transmission line devices, if the output received by the output circuit is fed back to the fluxon generating source at the opposite end of the transmission line, it is possible to realize devices capable of further various functions. Some examples of such devices will now be described in more detail.

Figure 30A:
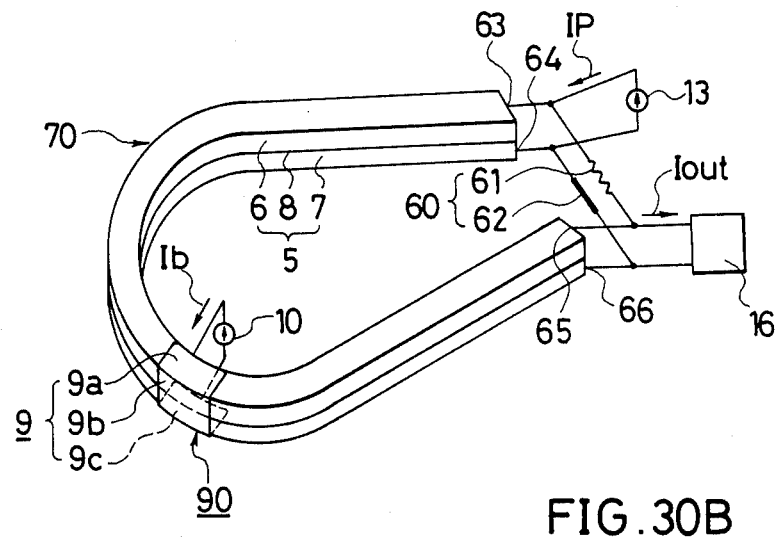
Figure 30B:
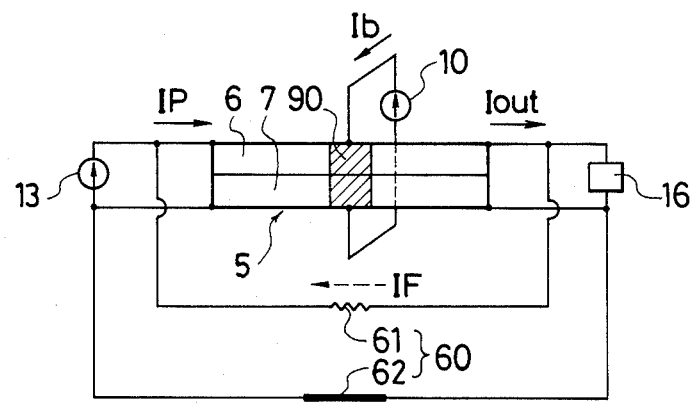

First, a device according to an eighteenth embodiment of the invention will be descrrbed with reference to FIGS. 30(A) to (C). As shown in FIG. 30(A) the device consists of a loop 70 constituted of an arcuate Josephson transmission line 5 and a feedback circuit 60. Although the Josephson transmission line 5 of the loop 70 in FIG. 30(A) is shown to be horseshoe-shaped, any other shape such as circular, rectangular or even straight as in the embodiments described earlier may be used insofar as the connection among the components described above can be realized. An equivalent circuit of the device is shown in FIG. 30(B) and a schematic representation of the device is shown in FIG. 30(C). In the schematic view, the Josephson transmission line 5 is represented simply as an open ring, the stopping position 90 is presented as a circle at an intermediate point on the transmission line, and the feedback circuit 60 consisting of a resistor 61 connecting the opposite ends of the transmission line and a conductor 62 is presented as the resistor 61 alone, with the current sources and the output circuit shown connected to the associated members at only one terminal.

This type of schematic representation will also be used in the description of other embodiments employing feedback circuits to be described in the following.

In the case of the loop 70 shown in FIG. 30(A), a fluxon stopping position 90 is provided at at least one point in the lengthwise direction of the Josephson line 5 (in the circumferential direction if viewed as a loop). The function of the stopping position 90 is the same as that in the embodiments described above.

In this embodiment, similarly to what is shown in FIGS. 2(A),(B), the stopping position 90 is shown to be formed by disposing a resistor element 9 so as to connect the pair of superconducting layers 6,7. The embodiment is not limited to this arrangement, however, and may employ either of the two basic structures of this invention.

Assuming that no stopping position 90 is used, when a fluxon generated between the two sides 63,64 at one end of the Josephson transmission line 5 propagates along the transmission line until reaching the other ends 65,66 and dying out, a part of the output thereof is fed back to the input end of the transmission line via the feedback circuit 60 consisting of the feedback resistor 61 and the conductor 62. As a result, a new fluxon is generated at the input end and travels through the transmission line toward the output ends 65,66, whereafter the same operation is repeated endlessly.

The operation of the embodiment will now be described with reference to FIG. 31. After a D.C. bias current $IP=I_{eo}$ has been applied in advance by the current source 13 for generating fluxons, a pulse current is superimposed on the bias current at time $t_1$, causing a fluxon to be generated at one end of the Josephson transmission line 5 of the Josephson transmission line loop 70. The D.C. bias current $I_{eo}$ is applied to facilitate generation of fluxons and should preferably satisfy the relationship of Equation (1) above.

The D.C. bias component $I_{eo}$ is of course unnecessary if the pulse current can be produced in sufficient magnitude.

At any rate, the fluxon generated at one end of the Josephson transmission line as described above eventually reaches the stopping position 90 and stops there. In this state, when as shown in FIG. 31(B) another driving current $I_b$ is supplied by the driving current source 10, the fluxon now stopped at the stopping position 90 resumes its travel and moves to the end of the transmission line. At this time a part of the vortex current is output in the form of output current $I_{out}$ as shown in FIG. 31(C). At the same time, the remainder of the vortex current is fed back via the feedback circuit 60 including the resistor 61 to the input end of the Josephson transmission line 5 and is applied thereto as a feedback pulse current IF.

Therefore, if at this time the D.C. bias current $I_{eo}$ is still being supplied by the fluxon generating current source 13, another fluxon will be generated at the input end of the Josephson transmission line 5. If by the time this fluxon reaches the stopping position 90, the driving current $I_b$ from the driving current source 10 has already fallen to zero, it will stop there, bringing the situation back to that at the beginning of this explanation.

On the other hand, as shown in FIG. 31(D), if the current $I_b$ produced by the current source 10 for selectively driving fluxons is maintained between $t_3$ and $t_4$, a fluxon which has returned to the stopping position 90 from the output end of the Josephson transmission line via the feedback circuit 60 will not stop at the stopping position but pass therethrough and return to the output end, from which it will again be output as an output current $I_{out}$ which will again be immediately returned to the input end as current component IF via the feedback circuit 60. The succeeding fluxon generated by this feedback will act in exactly the same way. The result will be that the output circuit 16 receives a train of pulses of a fixed period as shown in FIG. 31(E).

Considering the output circuit 16, it will be understood that the smaller the reactance component of this circuit is made, the larger will be the output current $I_{out}$ that can be extracted. Also, if the magnitude of the D.C. resistance component as seen from the output ends 65,66 of the Josephson line 5, that is the composite resistance $[1/(r_1+r_2)]+(1/r_3)^{-1}$ where $r_1$ and $r_2$ are the resistance values of the resistor 61 and the conductor 62 of the feedback circuit 60 and $r_3$ is the D.C. resistance component of the output circuit, is made of about the same order as that of the characteristic impedance of the Josephson transmission line 5, especially good results can be obtained since fluxons which reach the output end of the transmission line will not be reflected but will pass to the exterior. The characteristic impedance of the transmission line can be represented by $(L/C)^{\frac{1}{2}}$, where L and C are the inductance and capacitance per unit length of the Josephson transmission line, respectively.

From the foregoing, it will be clear that the conductor 62 of the feedback circuit 60 may be a superconductor (in which case $r_z=0$) or may have an intentionally selected resistance value, such as, for example, a resistance approximately equal to the resistance $r_1$ of the resistor 61. Therefore, the term "conductor" used here is to be understood in a broad sense to include not only good conductors with extremely low resistance but also conductors with an intentionally selected resistance component. From this point of view, the resistor 61 can if convenient be considered to be a first conductor and the conductor 62 to be a second conductor.

The embodiment of FIG. 30 can be operated to carry out the following digital functions depending on how it is used or, stated differently, depending on the purpose to which it is put.

First, it can be operated as a nondestructive read-out memory.

More specifically, if the state where a fluxon does (does not) reside at the stopping position 90 is defined as binary "1" (binary "0"), then the application of the current $I_b$ as shown in FIGS. 31(B),(D) is equivalent to a read command.

In the case where "1" is stored in the memory loop 70, the read command causes the value "1" to be output to and detected by the output circuit 16 in the form of the output current $I_{out}$ shown in FIG. 31(C) or (E).

On the other hand, when the bit stored in the memory loop 70 is "0", the issuance of the read command will not cause any output current $I_{out}$ to flow so that "0" will be read in the output circuit 16.

In either case, the result of the read-out will be fed back via the feedback circuit 60 and again stored at the stopping position 90, where it will wait for the next read command.

For erasing a "1" bit, supply of the D.C. bias component $I_{eo}$ by the fluxon generating current source 13 is discontinued at least during the time when a fluxon would otherwise be regenerated at the input end of the Josephson transmission line 5, whereby no fluxon will be generated since the feedback component is by itself not sufficient to produce a fluxon.

On the other hand for the writing of data, the bias component $I_{eo}$ is applied in advance and a pulse-like current supplied from a signal generating source constituting a part of the current source 13 is superimposed thereon for writing "1" or not superimposed thereon for writing "0".

The embodiment shown in FIG. 30 can also function as a pulse generator which operates in synchronism with the input signal.

More specifically, presume that with a fluxon stopped at the stopping position 90 the driving source 10 applies a pulse train such as that shown in FIG. 32(A) as an input signal. It will then be possible to obtain an output current pulse train like that shown in FIG. 32(B) in the output circuit 16 provided that the following relationship holds between (a) the time or period $T_s$ from the application of a given input driving current pulse to the stopping position to the application thereto of the following input driving current pulse and (b) the time $T_f$ that it takes for a fluxon stopped at the stopping position to start moving, leave the output end of the transmission line, return to the input end of the transmission line and form a new fluxon, and return to the stopping position 90 (in other words the time it takes the fluxon to make one lap of the Josephson transmission loop 70):

$$T_f < T_s \qquad (2)$$

Comparing the output and input current pulse trains, it will be noted that the output of the respective pulses is delayed relative to the input thereof by a time equal to the time that it takes for a fluxon to travel from the stopping position to the output end of the transmission line but that the period of the output current pulse train is identical with that of the input current pulse train. Needless to say, even if the period $T_s$ of the input pulses is irregular, the output pulses will follow the same pattern of irregularity insofar as the relationship expressed in Equation (2) above is satisfied.

The embodiment shown in FIG. 30 can also be operated as a frequency divider.

For example, a ½ frequency divider can be realized by establishing the following relationship between the aforesaid input signal period, i.e. the aforesaid driving current pulse period $T_s$, and the time $T_f$ required for a fluxon leaving the stopping position 90 to return via the feedback circuit 60 and again reach the stopping position 90:

$$T_s < T_f < 2T_s \qquad (3)$$

Figure 33A:
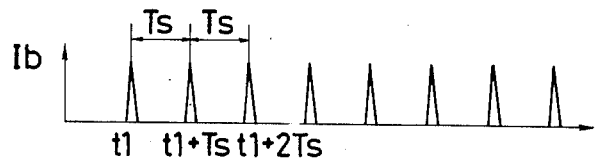
FIGS. 33(A) and (B) are time charts for still another mode of operation of the device shown in FIG. 30.
Figure 33B:

That is to say, if in FIG. 33(A) a driving current pulse $I_b$ is supplied to the stopping position 90 at time t causing a fluxon to start moving, an output current pulse $I_{out}$ as shown in FIG. 33(B) will be obtained when this fluxon reaches the output end. However, at the time the second driving current pulse $I_b$ is applied to the stopping position 90 after the lapse of time $T_s$ from the application of the first driving pulse, the second fluxon generated as a result of the feedback of the first fluxon will still not have reached the stopping position 90 so that in a sense the application of the second driving current pulse to the stopping position is wasted. By the time the third driving current pulse is applied at time $t_1 + 2T_s$, however, the fluxon will have returned to the stopping position 90 so that the application of the third driving current pulse will again result in appearance of an output current pulse $I_{out}$ at the output circuit 16.

As the third driving current pulse can be considered to correspond to the first such pulse, it will be understood that the above-described operation repeats itself, whereby the period of the output pulse train becomes $2T_s$ as compared to the period of $T_s$ for the driving current pulse train $I_b$ constituting the input signal pulse train. Therefore, there is obtained at the output circuit 16 an output pulse train of a frequency that is one-half that of the input pulse train.

Generalizing on the relationship expressed by (3) above, it will be understood that by satisfying the following relationship, it is possible to realize a frequency divider of any desired frequency division ratio 1/n:

$$(n-1)T_s < T_f < nT_s \qquad (4)$$

where $n = 2, 3, \ldots$

Although the devices described up to this point have had only one stopping position 90 provided on the Josephson transmission line 5, they are nevertheless able to carry out a wide range of functions depending on the current levels and the sequence of operation of the current sources.

As might be surmised from this, if the Josephson transmission loop is provided with a plurality of stopping positions 90 each having its own current source for selectively driving fluxons, it is possible to realize devices capable of carrying out an even more diverse range of functions.

Figure 34:
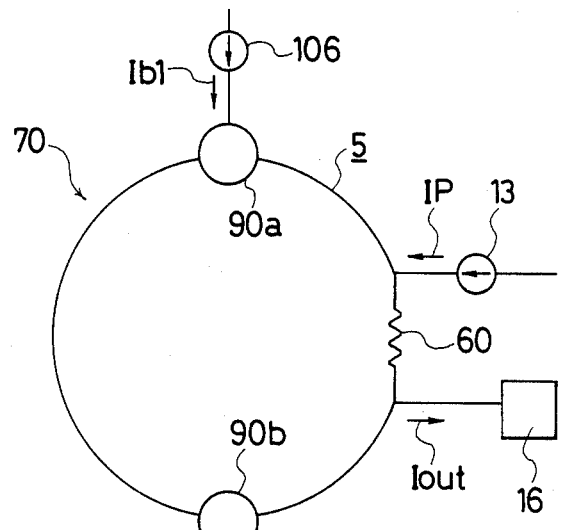
FIG. 34 is a schematic view of a nineteenth embodiment of the invention.

This will be shown first through an explanation of the various capabilities of a device having two stopping positions, with reference to a nineteenth embodiment of the invention illustrated in FIG. 34.

In the embodiment shown in FIG. 34, the Josephson loop 70 has two stopping positions 90a, 90b spaced by appropriate intervals on the loop circumference and provided with respective exclusive driving current sources 106, 107. The other components of the device are identical to those of the embodiment shown in FIG. 30 and will not be described again here.

In order to put the device in the initial condition required for it to carry out various functions, current is supplied by the fluxon generating source 13 so as to cause a fluxon to be generated, move counterclockwise around the loop to stopping position 90a and stop there.

Figure 35A:
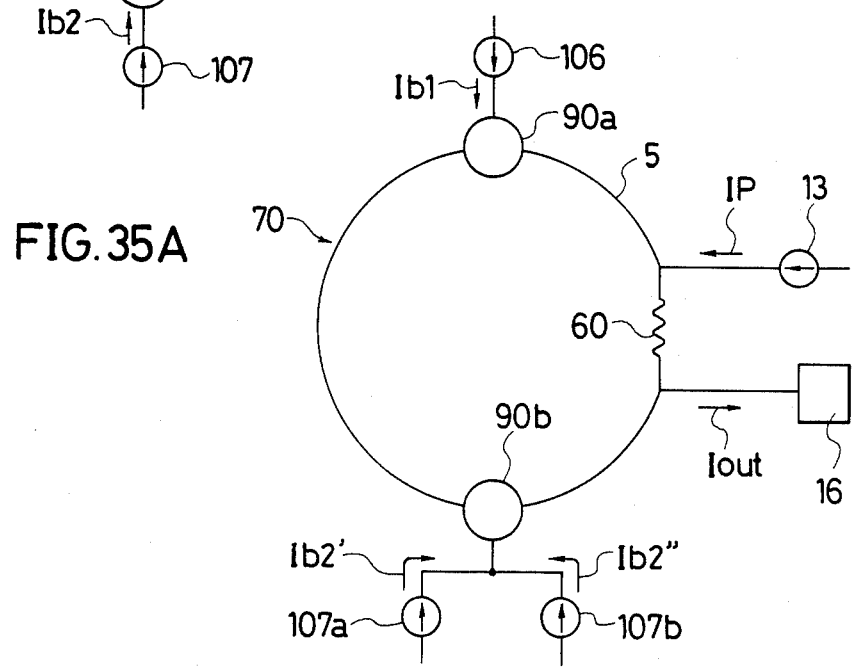
FIGS. 35(A) to (E) are schematic views for explaining a twentieth embodiment of the invention.

Here, if as shown in a twentieth embodiment of the invention illustrated in FIG. 35(A), the second current source connected to the second stopping position 90b is constituted of two current sources 107a, 107b so as to selectively apply the sum of the logic signal currents $I_{b2}'$ and $I_{b2}''$ to the second stopping position 90b and the current source 106 connected to the first stopping position 90a is considered to be the first logic signal source while the current source 107a connected to the second stopping position 90b is considered to be the second logic signal source, then the logical product of the two logic signals will be obtained as an output in the output circuit 16.

In considering the operation of this device, the state in which the first logic signal current $I_{b1}$ flows from the current source 106 of the first stopping position 90a and the second logic signal current $I_{b2}'$ from the second current source 107a of the second stopping position 90b will both be defined as the logic value "1", and the same definition will also be applied to the output current $I_{out}$.

Figure 35B:
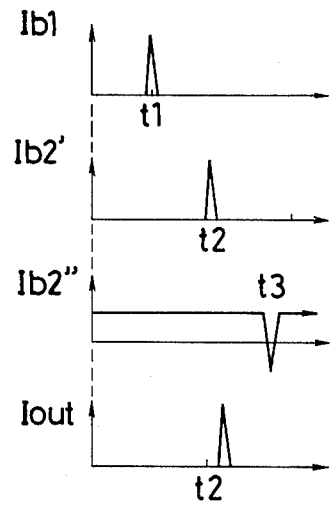
Figure 35C:
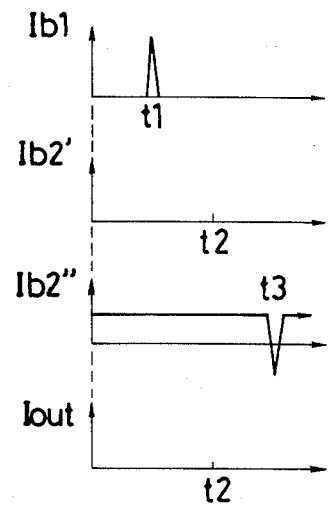

FIG. 35(B) is a time chart for demonstrating that when $I_{b1}=1$ and $I_{b2}'=1$ the logical product $1\times1=1$ is obtained as the output, that is for showing that under such condition the output current $I_{out}$ flows. On the other hand, FIG. 35(C) is a time chart for demonstrating that when $I_{b1}=1$ and $I_{b2}'=0$ the proper logical product $1\times0=0$ is obtained as the output, that is for showing that under such condition the output current $I_{out}$ does not flow.

Logic signal current $I_{out}$ is applied at time $t_1$ and logic signal current $I_{b2}'$ is applied at $t_2$.

In the case shown in FIG. 35(B), when signal current $I_{b1}$ of a logic value "1" is applied at time $t_1$ with the device in the initial state described above, the fluxon stopped at the first stopping position 90a will travel to and stop at the second stopping position 90b.

Then if signal current $I_{b2}'$ a logic value "1" is applied at time $t_2$, the fluxon stopped at the second stopping position 90b will again begin traveling and, albeit with some degree of delay, will be output to the output circuit 16 as output current $I_{out}$ representing the logic value "1". Also at this same time and provided that a D.C. bias current $I_{eo}$ which satisfies the relationship of Equation (1) is being applied to the input end of the Josephson transmission line, the feedback current passing through the feedback circuit will, in accordance with the mechanism described earlier, be superimposed on the D.C. bias current $I_{eo}$ and cause a new fluxon to be generated at the input end of the transmission line. This new fluxon will travel to and stop at the first stopping position 90a. That is to say, as soon as the device completes the logical operation $1\times1=1$, it automatically returns itself to the initial stage for carrying out the next operation.

The current $I_{b2}'$ from the other current source 107b connected with the second stopping position 90b is, as shown in FIGS. 35(B),(C) a negative reset pulse issued at time $t_3$ following the application of the second logic signal at time $t_2$. However, in the case of the logical operation $1\times1=1$, this reset pulse has no effect and, as explained above, the circuit is automatically reset.

In the case of FIG. 35(C), signal current $I_{b1}$ representing logic value "1" is applied at time $t_1$, similarly to what was described regarding FIG. 35(B). However, at time $t_2$ for applying the second logic signal current with respect to the so-generated fluxon now stopped at stopping position 90a there is applied signal current $I_{b2}'$ of logic value "0" (meaning that no current $I_{b2}'$ flows) so that the fluxon stays as it is at the second stopping position 90b. Therefore, the output circuit 16 receives an output current signal of logic value "0" (meaning that no current Iout flows), whereby the result of the operation $1\times0=0$ is obtained.

In the case of the operation $1\times0=0$, the reset pulse $I_{b2}''$ from the current source 107b issued at time $t_3$ has the effect of causing the fluxon left at the second stopping position 90b to return to the first stopping position 90a, where it again comes to rest. The device is thus reset to its initial state and made ready for the next operation.

When $I_{b1}=0$ and $I_{b2}'=1$ or when both $I_{b1}$ and $I_{b2}'$ are "0", since a current representing the logic value "0" (i.e. the absence of current $I_{b1}$) is applied at $t_1$, the fluxon stopped at the first stopping position 90a stays where it is. Therefore, regardless of whether current is applied to the second stopping position 90b at $t_2$ and even if the reset pulse $I_{b2}''$ is applied thereafter, the circuit retains its initial state without change so that there is no output current sent to the output circuit 16 at the time between $t_2$ and $t_3$ for detecting the result of the operation, meaning that the device produces the required output of the logic value "0".

The embodiment illustrated in FIG. 35(A) can also be operated as an inverter for carrying out NOT operation.

Figure 35D:
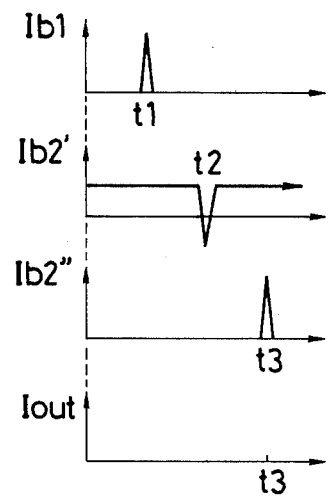
Figure 35E:
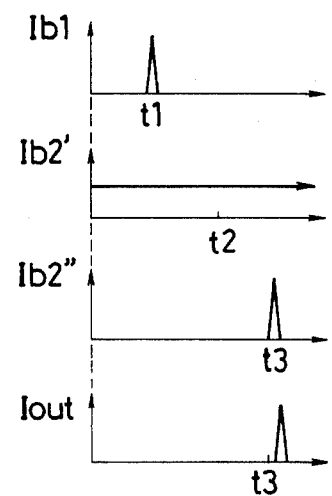

FIG. 35(D) is a time chart for demonstrating that when negative current $I_{b2}'$ representing the logic value "1" is supplied as an input current by the current source 107a connected to the second stopping position 90b, a positive output current $I_{out}$ representing the logic value "0" (i.e. the absence of the output current $I_{out}$) is received by the output circuit 16 On the other hand, FIG. 35(E) is a time chart for demonstrating that when the logic value of the input signal current $I_{b2}'$ is "0" (i.e. when no current $I_{b2}'$ flows), a positive output current $I_{out}$ representing the logic value "1" is received by the output circuit 16.

As in the foregoing cases, the initial state of the circuit is defined as that where a fluxon is stopped at the first stopping position 90a. Then at time t1 driving current $I_{bl}$ is supplied by the current source 106, causing the fluxon at the first stopping position 90a to be sent to the second stopping position 90b.

If at time $t_2$ for applying the input logic signal, a signal of a logic value "1" is applied, that is if as shown in FIG. 35(D) a negative current $I_{b2}'$ is supplied to the second stopping position 90b at time $t_2$, the fluxon stopped at this stopping position 90b will travel in the reverse direction toward the input end of the transmission line and stop again at the first stopping position 90a. On the other hand, if a signal representing a logic value "0" is applied, that is if as shown in FIG. 35(E) no current $I_{b2}'$ is supplied at $t_2$, the fluxon stopped at the second stopping position 90b will stay where it is.

Therefore, if at $t_3$ a signal current $I_{b2}''$ is supplied by the other current source 107b associated with the second stopping position 90b to indicate that it is the time for outputting the result of the logical operation, then since in the case that the logic value "1" was input no fluxon is present at the second stopping position 90b, there will naturally be no flow of output current $I_{out}$ to the output circuit 16. Therefore, the logic value "1" is output On the other hand, when the logic value "0" was input, the fluxon stopped at the second stopping position 90b is driven to travel toward the output end so that the output circuit eventually receives an output current Iout representing the logic value "1".

In the case where the logic value "0" is output, a fluxon was again present at the first stopping position 90b in the preceding stage of operation, and in the case where the logic value "1" was output, feedback via the feedback circuit 60 will, in accordance with the mechanism already explained several times, cause a new fluxon to be generated in the Josephson transmission line and to travel to and stop at the first stopping position 90b. As a consequence, in view of the situation following time $t_3$, it will be understood that the circuit will reset itself to the initial condition even without the application of a reset pulse.

Figure 36A:
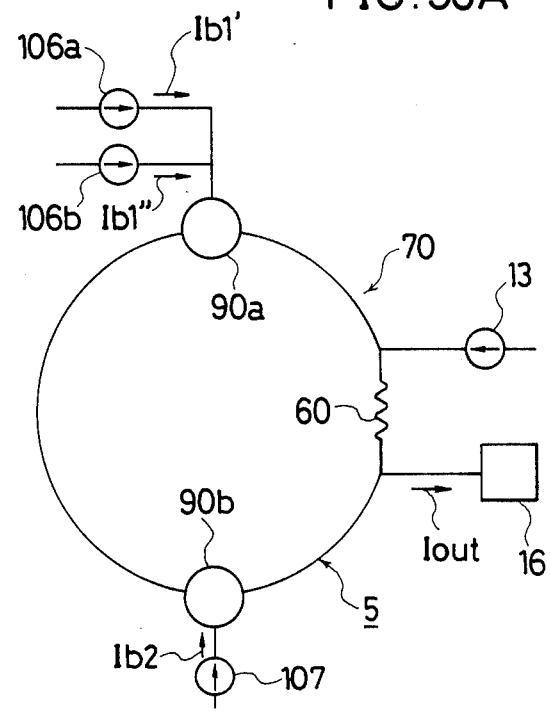
FIGS. 36(A) to (C) are schematic views for explaining a twenty-first embodiment of the invention.

Next, consideration will be given to an arrangement in which, as in a twenty-first embodiment shown in FIG. 36(A), the embodiment of FIG. 34 is provided with a plurality of current sources associated with the first stopping position 90a. (In the embodiment of FIG. 36(A) the number of these current sources is held to two for the sake of simplicity of explanation.) With this structure, if the state where the currents $I_{b1}'$ and $I_{b1}''$ flow (do not flow) is defined as the logic value "1" ("0"), it is possible to carry out a logical OR operation with respect to the logical values represented by said currents.

Figure 36B:
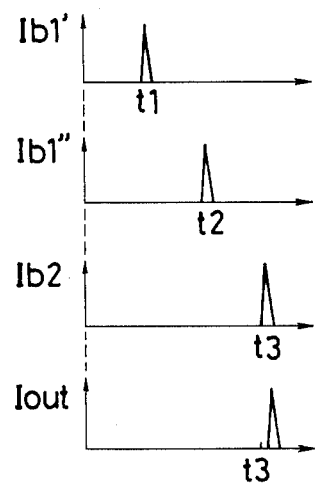
Figure 36C:
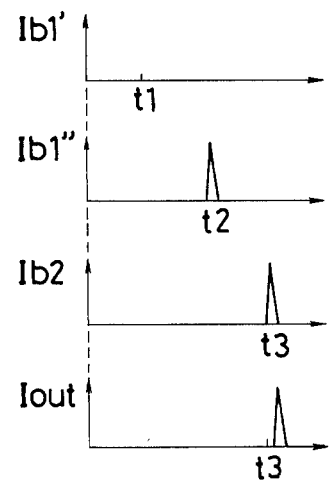

FIG. 36(B) is a time chart for explaining the logical OR operation $1+1=1$, and FIG. 36(C) is a time chart for explaining the logical OR operation $0+1=1$. In this example as well, the application of the current $I_{b1}'$ by the current source 106a is defined as the "1" state of the first logic signal and the application of the current $I_{b1}''$ by the source 106b is similarly defined as the "1" state of the second logic signal, with the state when these currents $I_{b1}'$ and $I_{b1}''$ do not flow being defined as the "0" state of the logic signal.

The manner of operation of this embodiment is obvious. Assume that the device is in the above-described initial state with a fluxon stopped at the first stopping position 90a and that the first logic signal is applied to the first stopping position 90a in the form of the current $I_{b1}'$ at time $t_1$. Then if as shown in FIG. 36(B) this input logic signal is "1", the fluxon stopped at the first stopping position 90a will be caused to travel to and stop at the second stopping position 90b. On the contrary, if as shown in FIG. 36(C) this input logic signal is "0", the fluxon stopped at the first stopping position 90a will simply stay as it is at time $t_1$.

Next consider the situation at time $t_2$ when the second logic signal is applied. In the case of FIG. 36(B), since the fluxon has already moved to the second stopping position 90b, even if current $I_{b1}''$ representing a "1" state logic signal is applied to the first stopping position 90a, no change will take place and the fluxon will remain stationary at the second stopping position 90b. On the other hand, in the case of FIG. 36(C), if current $I_{b1}''$ representing state "1" is applied at this time, the fluxon still stopped at the first stopping position 90a will be caused to move to and stop at the second stopping position 90b. Consequently, from time $t_2$ to time $t_3$ the same situation will prevail in both the case of FIG. 36(B) and the case of FIG. 36(C); that is in either case the fluxon will move to the second stopping position 90b and stay there.

Therefore, when at time $t_3$ for reading the result of the operation, driving current $I_{b2}$ is supplied as reading current by the current source 107 associated with the second stopping position 90b, the fluxon stopped at the second stopping position 90b will in either case travel to the output end of the transmission line, where a part of the vortex current will be output as an output current $I_{out}$ representing the logic value "1" while the remainder thereof will be fed back to the input end of the transmission line via the feedback circuit 60 and be superimposed on the D.C. bias current $I_{eo}$ from the d.c. bias source 13 so as to form a new fluxon which will travel to and stop at the first stopping position 90a thereby restoring the circuit to its initial state and putting it in on standby for the next operation.

That the device carries out the operation $1+0=1$ is obvious from the following. Namely, in FIG. 36(B) if at time $t_2$ for applying the second logic signal no current $I_{b2}$ should be applied in order to represent the "0" state, this would have no effect on the operation of the device since the fluxon will have already moved to the second stopping position 90a at the preceding stage of operation. Further, it is obvious that the logical OR operation $0+0=0$ is carried out from the fact that this operation would have no effect on the fluxon stopped at the first stopping position 90a when the device is in its initial state.

Figure 37A:
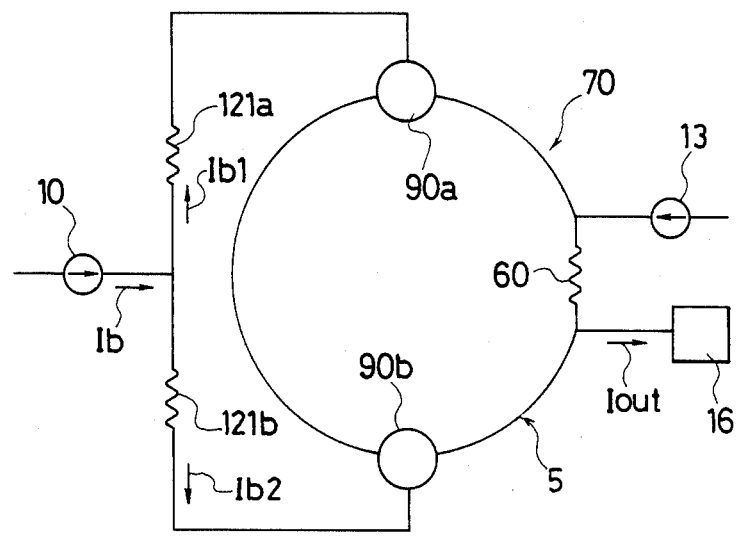
FIGS. 37(A) and (B) are schematic views for explaining a twenty-second embodiment of the invention.

The embodiment shown in FIG. 34 can, moreover, be made to operate as a frequency divider by devising a different mode of application of the driving currents to the first and second stopping positions 90a, 90b. More specifically, this can be achieved as shown in a twenty-second embodiment of the invention illustrated in FIG. 37(A) by using a single driving current source 10 for producing an input signal of a period $T_s$ and applying this input signal as current pulses $I_b$ occurring at periods of $T_s$ to two resistors 121a, 121b (which may be of the same value) so as to divide the pulses and apply them to both stopping positions 90a, 90b.

Figure 37B:
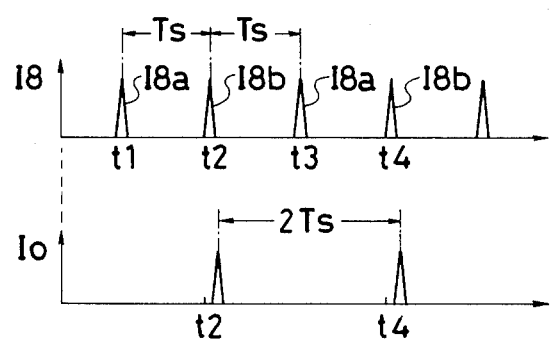

As before, in its initial state the device has a fluxon stopped at the first stopping position 90a. Then, if input signal current pulses $I_b$ are supplied at a given period $T_s$ in the manner shown in FIG. 37(B), a part of the first pulse supplied at time $t_1$ will pass through the first resistor 121a and cause the fluxon stopped at the first stopping position 90a to travel to and stop at the second stopping position 90b. As in the preceding embodiments, the width of the input pulse is of course selected such that the pulse will have fallen to zero before the fluxon leaving the first stopping position 90a reaches the second stopping position 90b.

In this state, when at time $t_2$, the next input pulse $I_{b2}$ is applied, the part of the current passing through the second resistor 121b will cause the fluxon which has now reached the second stopping position 90b to resume its travel toward the output end of the transmission line, from which a part of the vortex current will be output to the output circuit 16 and the remainder will be simultaneously returned via the feedback circuit to put the device back in its initial state.

Therefore, the input of the third pulse at time $t_3$ will cause the device to operate in the same way as the first one did and the input of the fourth pulse at time $t_4$ will cause it to operate in the same way as the second one did, whereafter the same cycle of operation will be repeated continuously. As a result the period of the train of output pulses $I_o$ will be $2T_s$, meaning that the frequency has been divided in half.

From the embodiment shown in FIG. 37 it will be understood that a frequency divider of any frequency division factor "n" can be realized by providing the n-stopping positions and distributing the input signal current among the respective stopping position through current dividing resistors.

It should be noted, however, that in this case it is necessary to use current pulses of a width shorter than time that it takes a fluxon to travel from one stopping position to the next.

This however is no particular limitation since there have already been developed Josephson pulse generators capable of producing current pulses of considerably narrow width and, moreover, since as will be explained later it is possible to provide a current source for controlling fluxon travel time at an intermediate portion of the transmission line and to use this current source for slowing the fluxon travel speed as desired (but still within an adequately high speed range as compared with conventional semiconductor devices and the like). Therefore, within the range that it is possible to maintain the divided input currents at a significant level, it is possible to realize considerably high frequency division factors.

Next there will be described a twenty-third embodiment of the invention which, though it comprises numerous stopping positions on a Josephson transmission line loop, carries out functions of a different kind.

Figure 38A:
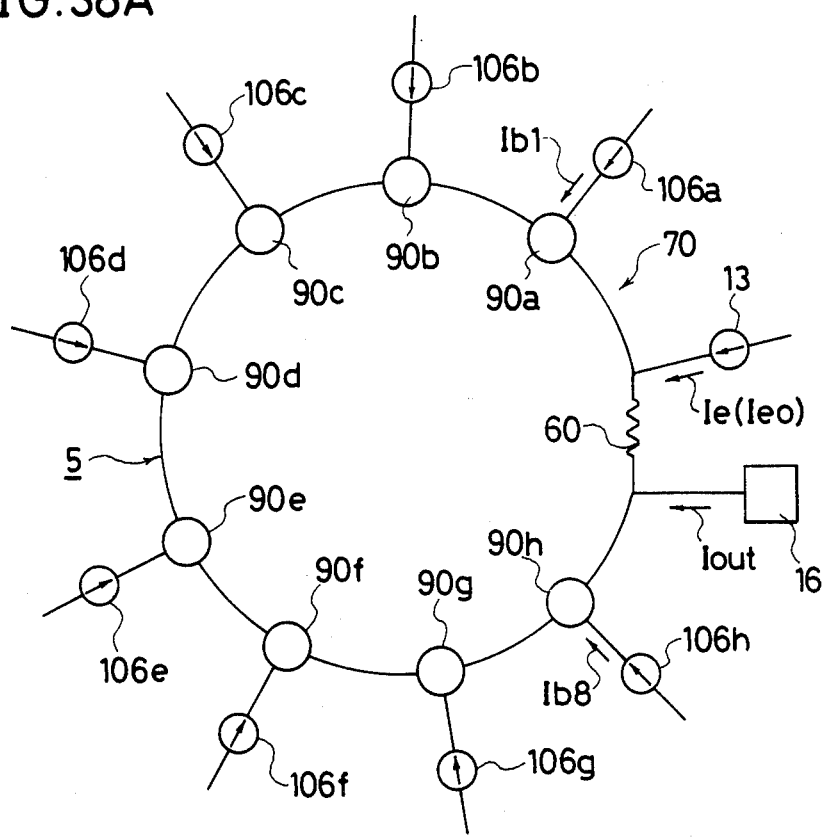
FIGS. 38(A) and (B) are schematic views for explaining a twenty-third embodiment of the invention.

The twenty-third embodiment is shown in FIG. 38(A) and, by way of example, has eight stopping positions $90a$ to $90h$ which are provided with respective current sources $106a$ to $106h$. The device having this circuit system can, for example, be used as an 8-bit serial-write, serial read-out nondestructive memory. The operation in this case will be explained with reference to FIG. 38(B).

Writing of data is carried out as follows:

A D.C. bias current $I_{eo}$ satisfying the relationship of Equation (1) is supplied to the input end of the Josephson transmission line 5 in advance by a current source 13 connected therewith, and then at writing times $t_1$ to $t_8$ spaced from each other by a prescribed time interval, currents $I_{b1}$ to $I_{b8}$ are supplied all together from current sources $106a$ to $106b$ associated with the stopping positions $90a$ to $90h$, respectively.

Figure 38B:
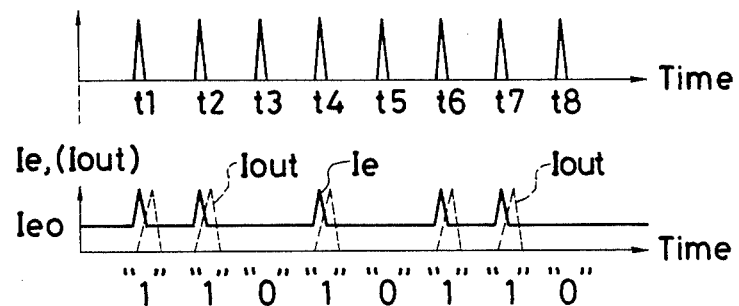

Synchronously with this, using the fluxon generating current source 13 as a writing logic signal source, fluxon generation current pulses $I_e$ are selectively generated at the times for writing of the respective bits so as to be superimposed on the D.C. bias component in accordance with the bit pattern to be written. If the presence of a fluxon is defined as the "1" state, then in a case such as shown in FIG. 38(B) where the bit pattern to be written is beginning from the highest figure bit, 1 1 0 1 0 1 1 0, writing pulses I are produced by the current source 13 at times $t_1,t_2,t_4,t_6,t_7$ but are not produced at times $t_3,t_5,t_8$.

By this method, the fluxon generated at the input end of the transmission line at $t_1$ moves to and stops at the first stopping position $90a$ during the rest period of the driving current $I_{b1}$ up to the time $t_2$. Then at $t_3$ for writing of the second bit, driving current $I_{b1}$ is again applied to the first stopping position $90a$ (while like current is also supplied to the other positions), causing the fluxon stopped at the first stopping position $90a$ to travel to and stop at the second stopping position $90b$ during the rest period of the driving current up to time $t_3$. On the other hand, the fluxon repesenting the "1" state that was generated at time $t_2$ also in a similar manner travels to and stops at the first stopping position $90a$ by the time $t_3$.

By the repetition of this operation, a bit pattern identical with the input bit pattern is by the time $t_8$ sent to the eighth to first stopping positions $90h$ to $90a$ which as a result store the highest figure bit to the lowest figure bit.

In the reading of data, a D.C. bias current $I_{eo}$ is again applied by the current source 13 and with the device in this state driving current is applied all at one time by the current sources $106a$ to $106h$ in precisely the same manner described in connection with FIG. 38(B). As a result, the fluxon stopped at the eighth stopping position $90h$ is sent to and output from the output end of the Josephson transmission line 5 at time $t_1$. (In this case, since the value of the most significant bit is "1", the output circuit 16 receives an output current pulse $I_{out}$ as indicated by the broken line in FIG. 38(B).) At the same time, the next and subsequent bits are each moved to the next stopping position and, moreover, as current corresponding to the output data is also returned to the input end of the Josephson transmission line by the feedback circuit 60 and superimposed on the D.C. bias current $I_{eo}$, the same data is again generated in the transmission line. Then, at time $t_2$, the second most significant bit which is now at the eighth stopping position $90h$ is in a similar manner output to the output circuit 16 while current corresponding to this data is simultaneously fed back via the feedback circuit 60 to regenerate the data in the transmission line. The remaining bits are again each advanced by one stopping position. The same operation is then repeated as many times as required to read out all of the bits.

That is to say, these transfer, output and feedback operations are repeated in the same way at each of the ensuing reading times $t_3$ to $t_8$ so that by time $t_8$ the output circuit 16 has received a bit pattern which, as shown by the broken lines in FIG. 38(B), is identical with the input bit pattern. Moreover, even after the reading of all bits, the Josephson transmission line still retains the same bit pattern.

When it is desired to erase the stored data, the above-described reading operation is carried out without applying the D.C. bias from the current source 13. Since the fed back portion of the vortex current is not by itself sufficient to generate fluxons at the input end of the transmission line, the data will not be regenerated but will be destroyed by the reading operation.

Also, as was touched on earlier, if only a single fluxon is caused to be present in the loop 70 of the structure shown in FIG. 38(A) and the driving current sources $106a$ to $106h$ are considered to be sources producing input pulse signals of a prescribed frequency, then if these pulses are all applied simultaneously to the stopping positions $90a$ to $90h$ at the timing shown in FIG. 38(B), the output circuit 16 will receive an output signal of a frequency that is one-eighth that of the input signal. In other words, the device will operate as a $\frac{1}{8}$ frequency divider.

The above-described memory and frequency divider can of course be realized as other than 8-bit devices and, in general, as n-bit devices.

Figure 39:
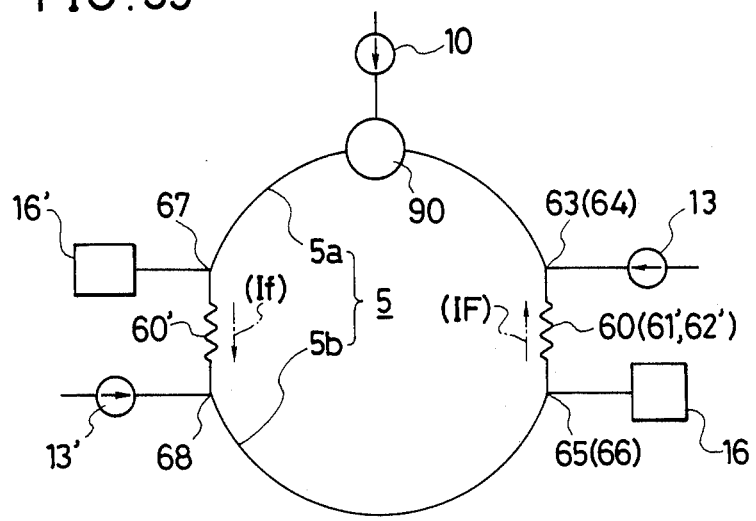
FIG. 39 is a schematic view for explaining a twenty-fourth embodiment of the invention.

It will be noted that in the embodiments described up to this point, the output circuit 16 has in all cases received output current only from the output end of the Josephson tranmission line 5 of the Josephson transmission loop 70, i.e. only from the end to which the input end of the feedback circuit 60 is connected. It is, however, possible to provide an output circuit at an intermediate position on the transmission line as is the case in a twenty-fourth embodiment of the invention shown in FIG. 39.

Similarly to the preceding embodiments, the device according to this embodiment also comprises a feedback circuit 60 constituted of first and second conductors 61,62 and connected between the input ends 63,64 and the output ends 65,66 of the transmission line 5 of the Josephson transmission loop. Also the arrangement is identical with that of the embodiment shown in FIG. 30 in the point that it has a current source 13 at its input end, a first or main output circuit 16 at its output end, a stopping position 90 at an intermediate portion of the transmission line 5, and a current source 10 connected with this stopping position 90. Where it differs is that the Josephson transmission line is split into an input side Josephson transmission line segment 5a and an output side Josephson transmission line segment 5b, with the opposing segment ends 67,68 thereof being connected by a connecting circuit 60' consisting of first and second conductors which may be the same as the first and second conductors of the above-mentioned feedback circuit 60.

Further, the output end 67 of the input side segment 5a is connected to a second output circuit 16' and the input end 68 of the output side segment 5b is connected to a current source 13' for selective generation of fluxons. The output circuit 16' and the second current source 13' may be of the same structure as the main output circuit 16 and the main current source 13, respectively.

The basic operation of this device proceeds as follows. By the same mechanism as described in conjunction with the embodiment shown in FIG. 30, a fluxon is generated and caused to stop at the stopping position 90 and a current is supplied by the selective driving source 10, causing the fluxon to be output to the output circuit 16. In the course of being output to the output circuit 16, however, a part of the vortex current of the fluxon is output to the second or auxiliary output circuit 16' at the output end 67 of the input side Josephson transmission segment 5a.

At the same time, because of the feed-forward circuit constituted by the first and second conductors of the connecting circuit 60', a part ($I_f$) of the remainder of the vortex current is passed to the input end 68 of the output side Josephson transmission line 5b, whereby another fluxon will be generated at the input end 68 provided that a D.C. bias current $I_{eo}$ satisfying the relationship of Equation (1) is supplied to the input end 68 by the second current source 13'.

As a result, when the fluxon reaches the end of the overall Josephson transmission line 5 and is extinguished, the associated vortex current is supplied to the main output circuit 16 so that, as far as the output circuit 16 only is concerned, the device operates in entirely the same manner as the embodiment of FIG. 30. In other words, this is a device having two independent output circuits which at the same time is capable of carrying out exactly the same functions as the embodiment shown in FIG. 30.

Figure 40:
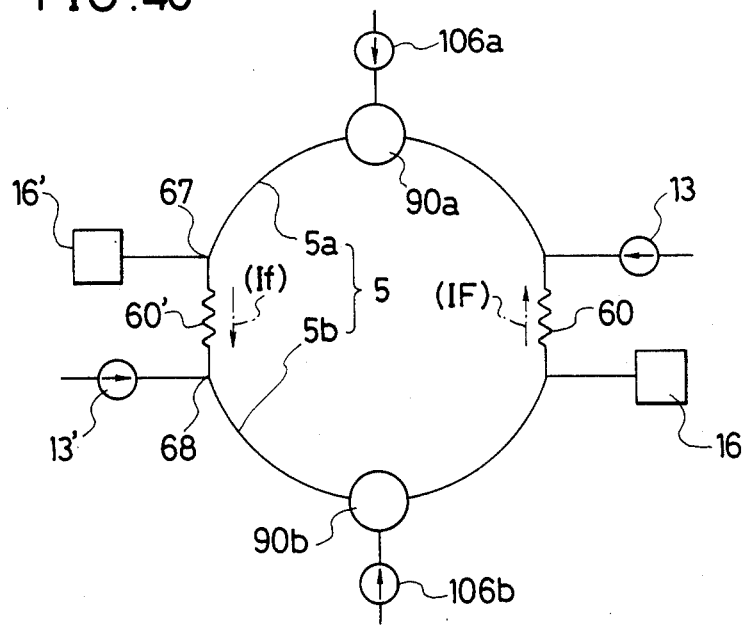
FIG. 40 is a schematic view for explaining a twenty-fifth embodiment of the invention.

Similarly, the twenty-fifth embodiment illustrated in FIG. 40 is a modification of the embodiment of FIG. 34. As with the embodiments illustrated in FIGS. 34 and 37, it is a device which not only is capable of operating as a frequency divider but is also able to provide two outputs. Structurally, it is comprised of the basic structure shown in the embodiments of FIGS. 34 and 37, plus the structural feature shown in FIG. 39 of dividing the Josephson transmission line 5 into an input side transmission line segment 5a and an output side transmission line segment 5b connected to each other via a connecting circuit As can be inferred from the embodiments shown in FIGS. 39 and 40, circuits with even more outputs can be realized by dividing the Josephson transmission line into a larger number of segments and providing each point of division with an output circuit and a D.C. bias source similarly to what was described in the foregoing. Particularly in the case of a device like that shown in FIG. 38, incorporation of the segmented structure shown in FIGS. 39 and 40 at points between adjacent stopping positions will make it possible to carry out parallel monitoring of the presence or absence of fluxons in the course of their simultaneous migration to neighboring stopping positions.

By combining a number of devices in accordance with the embodiments described above and by devising various current supply sequences, it is possible to come up with arrangements with a wide range of significant capabilities. One example of such a device will be described in connection with a binary counter shown as a twenty-sixth embodiment of the invention in FIG. 41.

The device according to this example is constituted by combining in cascade connection three devices 71,72,73 corresponding to devices according to FIGS. 34 or 37. The signal to be counted, a pulse current $I_b$ produced by the current source 10, is supplied via current dividing resistors 121a,121b to the first and second stopping positions 91a,91b of a first-stage Josephson transmission loop device 151. Thus the binary counter of this example accepts the pulses of the current $I_b$ as count data and carries out the count over the course of time.

To the input ends of the Josephson transmission lines 151,152,153 of the Josephson transmission loop devices 71,72,73 are respectively connected current sources 13a,13b,13c, each of which supplies a D.C. bias current $I_{eo}$ satisfying the relationship of Equation (1).

The counter is initialized by operating the current sources 13a,13b,13c so as to superimpose on the D.C. bias current $I_{eo}$ a pulse current $I_e$ of significant magnitude so as to generate fluxons and, in the same manner as in the embodiments described earlier, cause these fluxons to stop one each at the first stopping positions 91a,92a,93a of the Josephson lines of the respective loop devices 71,72,73.

Further, the output current $I_{o1}$ output to the output circuit 16a of the first-stage loop device 71 is also supplied through current dividing resistors 122a,122b to the first and second stopping positions 92a,92b of the second stage loop device 72, and the output current $I_{o2}$ output to the output circuit 16b of the second-stage loop device 72 is also supplied through current dividing resistors 123a,123b to the first and second stopping positions 93a,93b of the third-stage loop device 73. To the second stopping positions 91b,92b,93b of the loop devices 71,72,73 are connected respective selective fluxon driving current sources 106a,106b,106c, which, as will be explained in the following, are used for outputting the result of the count to the group of output circuits 16a,16b,16c after the input of data has been completed.

The operation of the counter will be explained with reference to FIG. 41(B), wherein the left column indicates input data (i.e. the number of pulses of current $I_b$ input during the data input period) and the center columns schematically indicate the positions of the fluxons in the respective loop devices 71 to 73 following the input of the input data. More precisely, when a small circle is shown at the top of one of the open rings, this indicates that the fluxon is located at the first stopping position 91a,92a or 93a of the corresponding loop device 71,72 or 73, and when it is at the bottom of the ring, this indicates that it is at the second stopping position 91b,92b or 93b.

Figure 41A:
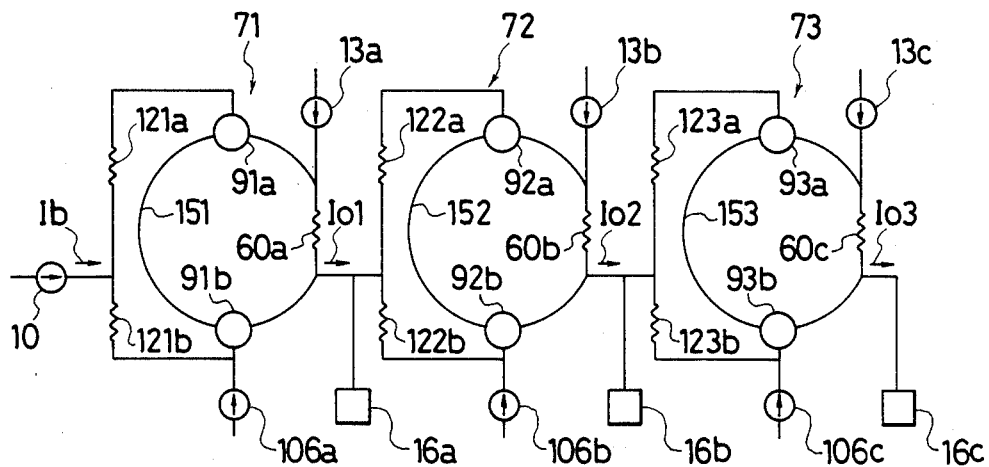
FIGS. 41(A) and (B) are a schematic view for explaining a twenty-sixth embodiment of the invention and a diagram for explaining the operation of the same.
Figure 41B:
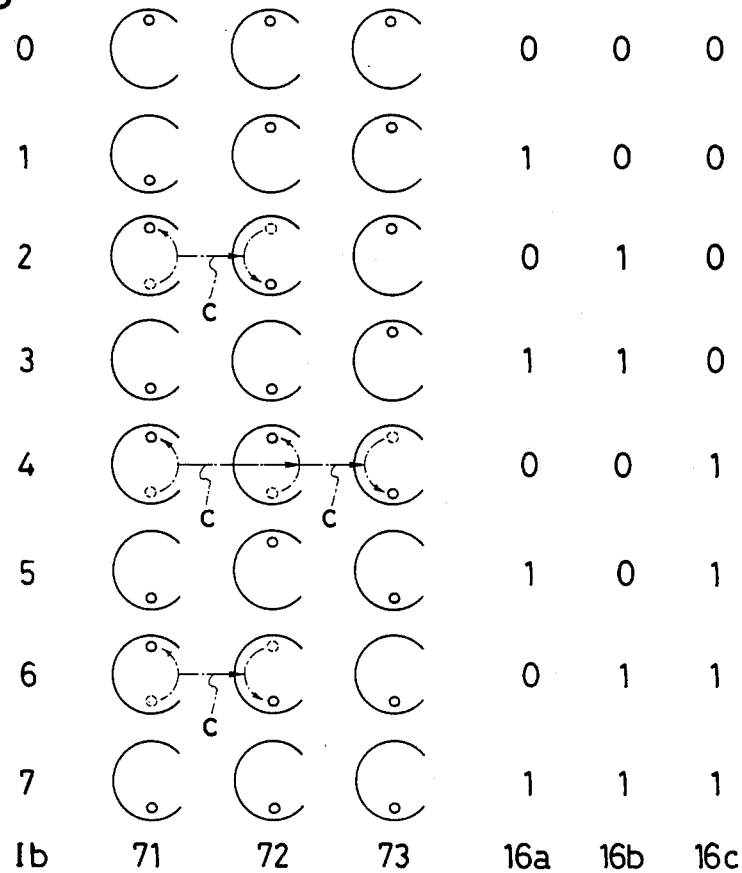

The groups of digits on the right side of FIG. 41(B) are, as will be explained later, the count result that appears in the output circuits 16a to 16c when the count result is output following completion of data input. The least significant digit is output to the output circuit 16a and the most significant ot the output circuit 16c.

Considering the process from the start to the end of data input, when the first pulse of the current $I_b$ is input to the first and second stopping positions 91a,91b of the first-stage loop device, the fluxon at the first stopping position 91a is moved to the second stopping position 91b and stays there.

When the input data exceeds the decimal value "1", the application of the second pulse of the current $I_b$ will cause the fluxon that moved to the second stopping position 91b of the first-stage device 71 to move to the output end of the Josephson transmission line 5a and be extinguished, as shown by the phantom curved arrow in FIG. 41(B). This will cause the output of a current $I_{o1}$, a part of which will be returned to the input end of the Josephson transmission line 151 where, together with the D.C. bias current supplied by the current source 13a, it will cause a new fluxon to be generated, whereafter the newly generated fluxon will travel to and stop at the first stopping position 91a of the Josephson transmission line 151. Simultaneously, as indicated by the phantom straight arrow c in FIG. 41(B), a part of the output $I_{o1}$ from the first-stage (least significant digit) loop device 71 will be forwarded to the first and second stopping positions 92a,92b of the second-stage loop device 72, whereby the fluxon present at the first stopping position 92a of the second-stage loop device 72 will be caused to move to and stop at the second stopping position 92b.

Thus each time a pulse of the input current $I_b$ is applied, the fluxon in the least significant digit loop device 71 is made to move from the first stopping position 91a to the second stopping position 91b and then from the second stopping position 91b to the first stopping position 91a. Moreover, in the two least significant digit loop devices 71,72, when the fluxon returns to the first stopping position 91a or 92a from the second stopping position 91b or 92b through the feedback circuits 60a, 60b, the fluxon in the loop device of the next higher figure bit portion is moved to the other stopping position, as shown by the arrow c.

As a result, the positions occupied by the fluxons in the respective loop devices after the count of the input data has been completed is as shown in FIG. 41(B).

After input of the count data has been completed, the next operation is that of outputting the result of the count. This is carried out by simultaneously applying a current to the second stopping positions 91b to 93b from the associated current sources 106a to 106c. When this is done, output current will be received by only those of the output circuits 16a,16b,16c associated with the loop devices having a fluxon stopped at the second stopping position after the count has been completed. If at this time the presence of output current is defined as the "1" state, then the output result of the count will be as shown by the groups of digits on the right side of FIG. 41(B), which represent a satisfactory count in the binary system provided that the output received by the output circuit 16a is taken as the least significant digit.

Once the reading operation is completed, it is necessary to reset the counter as a whole to the aforesaid initialized state to permit it to carry out the succeeding count operation. This can be accomplished simply by supplying from the current sources 106a to 106c currents of the opposite polarity from those used for the reading operation. This is because any fluxon present at the second stopping position of any of the loop devices following the completion of the reading operation will by the application of a negative current to the second stopping position concerned be caused to travel counterclockwise around the loop as viewed in the drawing and will therefore travel to and stop at the first stopping position without any effect on the neighboring loop of the next highest figure bit portion.

From the above-described mechanism it will be understood that in the present device the fluxon returns to its initial position after the input of every two current pulses and that upon the input of the second pulse, an output pulse or carrier pulse is forwarded as an input current pulse to the loop device of the next first figure bit portion. Therefore, if n number of loop devices are connected it will be possible to count up to $2^n - 1$ input current pulses.

Figure 42A:
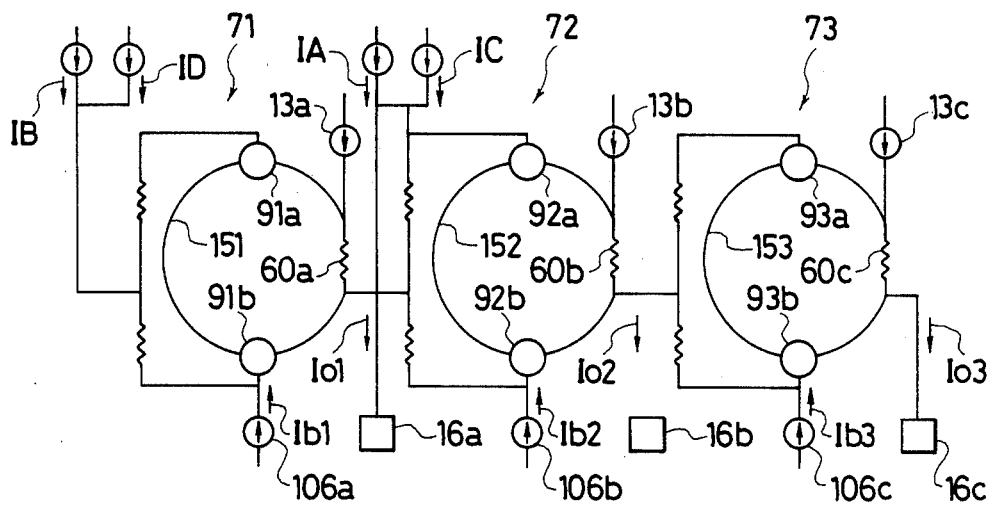
FIGS. 42(A) to (C) are a schematic view, a time chart and an explanatory view for explaining a twenty-seventh embodiment of the invention and the operation thereof.

In FIG. 42 there is shown a twenty-seventh embodiment of the invention which is of approximately the same structure as that of the embodiment of FIG. 41 except that a different mode of input is employed in order to realize a binary full adder. In this case, the two binary-figures "AB" from the high-order of an addend are added to the two binary-figures "CD" from the high-order of an augend. The result of the addition is obtained in the output circuits 16a to 16c, with the least significant digit of the sum appearing in the leftmost output circuit 16a shown in the figure. Further, it will be defined that in both addend and augend the case where the digits A,B,C,D equal binary "1" will be represented by the presence of currents IA,IB,IC,ID, respectively, from the corresponding current sources.

For the sake of simplicity of explanation, the presence of the dividing resistors will be ignored. In applying the currents IA,IB corresponding to the respective digits A,B of the first addend, the current IA for the higher figure bit is supplied to the first and second stopping positions 92a,92b of the second-bit loop device 72 and the current IB for the lower figure is supplied to the first and second stopping positions 91a,91b of the lowest-figure bit loop device 71.

Similarly, in applying the currents IC,ID corresponding to the respective digits C,D of the addend, the current IC for the higher-figure is supplied to the first and second stopping positions of the second-bit loop device 72 (but at a different timing from the supply of the current IA) and the current ID for the lower-figure is supplied to the first and second stopping positions 91a,91b of the lowest-figure bit device loop 71 (but at a different timing from the supply of the current IB).

The adder is initialized by having the current sources 13a to 13c superimpose pulse currents on the constant D.C. bias currents that they apply, thus causing a fluxon to be generated, move to and stop at each of the first stopping positions 91a to 91c.

Figure 42B:
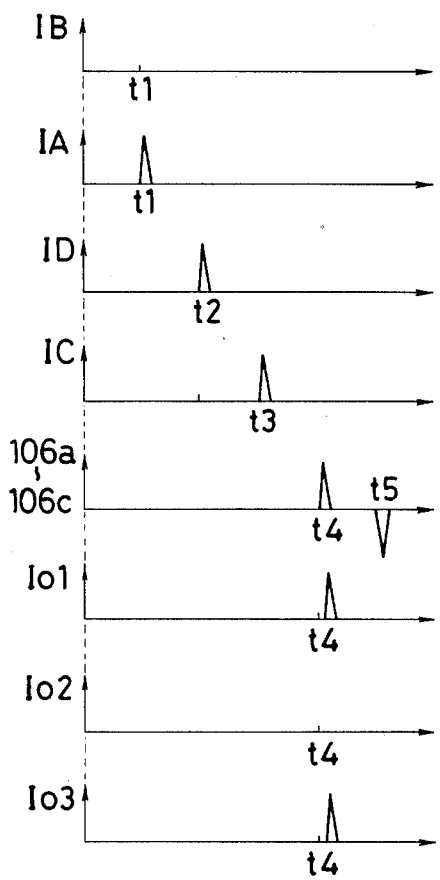

The operation of the adder will now be explained with reference to the time chart shown in FIG. 42(B). First, at time $t_1$ the higher- and lower-figure bits of the augend are input by supplying currents IA,IB to the stopping positions 92a,92b of second loop device 72 and to the stopping positions 91a,91b of the first loop device 71, respectively. Naturally, when a binary digit to be input is "0" the corresponding current IA or IB is not supplied.

On the other hand, the lower-figure bit of the addend is input by supplying or not supplying current ID to the first and second stopping positions 91a,91b of the loop device 71 at time $t_2$ and the higher-figure bit of the addend is input by supplying or not supplying current IC to the first and second stopping positions 92a,92b of the second loop device 72 at time $t_3$.

As an example, consider the case where the augend is 10 and the addend is 11. In this case, at time $t_1$ the higher- (lower-) figure bit of the the augend will be input to the first and second stopping positions 92a,92b (91a,9b) of the loop device 72 (71), Since in this example the lower-figure bit of the augend is "0", no current is supplied to the first and second stopping positions 91a,91b of the loop device 72 and only current IA corresponding to the higher-figure bit "1" will be supplied to the first and second stopping positions 92a,92b of the second loop device 72.

Figure 42C:
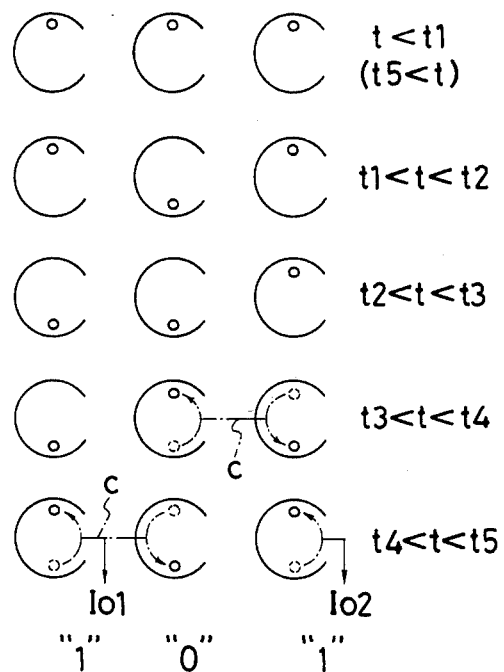

As a result, the positioning of the fluxons in the respective loop devices, which was initially as shown in the top row of open rings in FIG. 42(C), will be changed only in that the position of the fluxon in the second loop device 72 moves to the second stopping position 92b. This state is shown in FIG. 42(C) for the time $t_1 < t < t_2$.

Next at time $t_2$, current ID representing D=1 for the lower-figure bit of the addend is applied to the first and second stopping positions of the first loop device 71 and, as a result, the fluxon in the first loop device 71 is moved so that, as shown for time $t_2 < t < t_3$ in FIG. 42(C), the fluxons in the first and second loop devices are at the second stopping positions 91b,92b, while the fluxon in the highest-figure bit loop device remains at the first stopping position 93a.

Then at time $t_3$, current IC representing C=1 for the higher-figure bit of the addend is applied to the first and second stopping positions 92a,92b of the second loop device 72, causing the fluxon in the second loop device 72 to move to the output end of the Josephson transmission line 152 where a part of the output current $I_{o2}$ produced at the time of its extinguishment is, as shown by the straight arrow c, forwarded to the first and second stopping positions 93a,93b of the third (highest-figure bit) loop device 73 to cause the fluxon stopped at the first stopping position 93a of the third loop device 73 to move to the second stopping position 93b. This state, which is shown for time $t_3 < t < t_4$ in FIG. 42(C), represents the result of the calculation concerned by the present digital full adder.

For reading out the content of the adder, the current sources 106a to 106c connected to the second stopping positions 91b to 93b of the loop devices 71 to 73 simultaneously supply currents $I_{b1}$ to $I_{b3}$ as reading currents at time $t_4$. When this is done, only the output circuits 16a,16c associated with the loop circuits 71,73 which had fluxons present at their second stopping position at time $t_3 < t < t_4$ will receive output currents $I_{o1}$, $I_{o3}$ and the output circuit 16b associated with the second loop device 72 will receive no output current.

Therefore, the result of reading the adder content starting with the most significant bit will be 101, which is the proper result for the binary addition 10+11=101 for the augend and addend 10 and 11.

As was explained in the foregoing, the content of the adder is read out in the form of the output currents at the time $t_4 < t < t_5$. However, it will be noted that depending on the movement of the fluxons at this time, there may be loop devices in which a fluxon remains at the second stopping position following reading. For example, in the case just explained, this happens in the second loop device 72. Therefore, in order to prepare for the following addition operation, it is necessary to return the fluxon in such loop devices to the first stopping position so as to put the adder as a whole back in the initial state.

As in the counter described earlier, this can be easily accomplished by, as shown at time $t_5$, causing all of the current sources 106a to 106c to simultaneously supply to the second stopping positions currents of opposite polarity to those supplied for the reading operation thus causing any fluxons stopped at the second stopping positions to travel clockwise around the Josephson transmission loop as seen in the drawing and return to the first stopping positions. When this is done, the state of the device at time $t_5 < t$ will again be the same as that at time $t < t_1$ when the circuit was in its initial state.

Although only one example of the operation of this adder was set forth in the foregoing, it can easily be confirmed that the adder will also operate properly in other cases. Also it should be noted that by arranging n+1 loop devices of the same structure it will be possible to add and carry out the required carry operations for n-bit augend and addend By appropriately combining the embodiments described in the foregoing and by proper selection of the sequence of signal application, it is possible to realize a wide range of other applications beyond those already described.

Finally there will be described two relatively minor modifications which can be applied to any of the embodiments described above.

Figure 43:
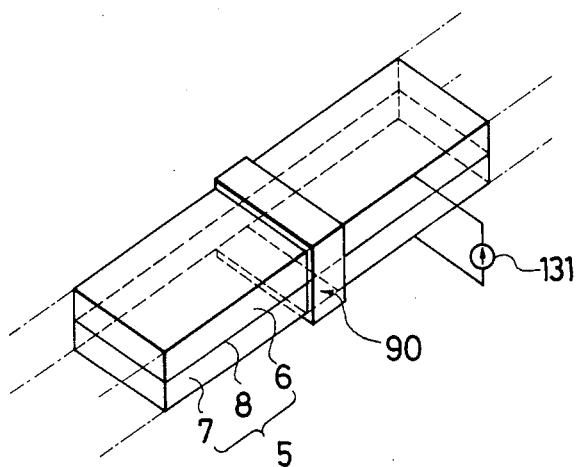
FIG. 43 is a schematic view for explaining a twenty-eighth embodiment of the invention.

As was touched on briefly earlier, even in an embodiment having a feedback circuit such as that shown in FIG. 43, it is possible to connect an auxiliary current source 131 to the Josephson transmission line at a point other than that where the stopping position is provided. With such an arrangement, it is for example possible to control the propagation velocity of fluxons within the Josephson transmission line, thus increasing the degree of freedom in circuit design.

Figure 44:
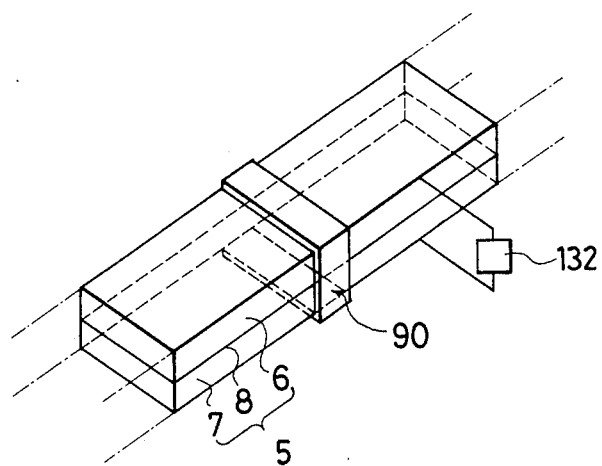
FIG. 44 is a schematic view for explaining a twenty-ninth embodiment of the invention.

Further, even in an embodiment having a feedback circuit such as that shown in FIG. 44, it is possible to provide an auxiliary output circuit 132 for extracting an output from an intermediate portion of the Josephson transmission line. In this case however, it is advisable to make the resistance component of the impedance of the output circuit 132 at least two or three times as large as the characteristic impedance of the Josephson transmission line $(L/C)^{\frac{1}{2}}$ so as to assure that the fluxons traveling along the Josephson transmission line will not be strongly affected. In other words, it is necessary to keep in mind that the output current obtainable from such an output circuit 132 will essentially be smaller than that obtained by the output circuit 16 provided at the output end of the Josephson transmission line.

In the Josephson transmission line device according to the present invention which has been described in the foregoing, if one of the superconducting layers is formed of Pb-Au alloy, the other superconducting layer is formed of Pb-In-Au alloy and the junction layer is formed of an oxide film of Pb-In-Au by discharging and the maximum current density of the Josephson transmission line is made 1 KA/cm$^2$, for example, then it is possible to obtain a spatial distribution of the fluxons within the Josephson transmission line of around 20 $\mu$m and a maximum fluxon propagation velocity $\bar{c}$ of around 10 $\mu$m/ps, whereby the pulse current extracted by the output circuit can be given a time half-width of 2–3 ps and be made extremely sharp. Therefore, if the dimensions of the device are appropriately selected, the pulse interval in the operation of the embodiments described in the foregoing can easily be made less than 10 ps so that extremely high-speed practical devices can be realized.

Further, if the Josephson transmission line is formed of a superconducting material having a large London penetration depth $\lambda_L$ such as niobium nitride (NbN), it is possible, as will be obvious from the following Equation (5), to make the Josephson penetration depth $\lambda_J$ small (the London penetration depth $\lambda_L$ of niobium nitride is 0.5 to 0.6 $\mu$m):

$$\lambda_J = \{h/[2e \cdot I_o \cdot \mu_o \cdot (d + 2\lambda_L)]\}^{0.5} \quad (5)$$

where d is the thickness of the junction; $\mu_o$ is the magnetic permeability in a vacuum; e is the elementary charge; h is equal to (Planck's constant)/$2\pi$; and $I_o$ is the maximum Josephson current density.

Therefore, if a Josephson transmission line of this type is used in the fabrication of devices such as the various embodiments described above, it will be possible to keep the overall dimensions to within a very small area, thus realizing a high degree of integration.

Although all of the embodiments described relate to digital devices, it is clear from the description that numerous analog applications are also conceivable.

At any rate, the present invention makes it possible to realize devices with lower power dissipation and much higher speeds than has been possible with conventional semiconductor devices or even with conventional Josephson devices. Moreover, from the fact that the applications set forth herein amount to only a small fraction of those conceivable, the present invention can be expected to make a major contribution to the electronics industry.

What is claimed is:

1. A Josephson transmission line device comprising:
   at least one Josephson transmission line consisting of a pair of superconducting layers and a junction layer disposed between said superconducting layers to constitute a Josephson junction;
   at least one fluxon generating current source connected across the pair of superconducting layers for supplying fluxon generating current to the Josephson transmission line in order to generate fluxons therein;
   at least one resistor element connected in parallel with said Josephson junction of said Josephson transmission line so as to form a fluxon stopping position in said Josephson transmission line, said fluxon stopping position being adapted to consume the energy of movement of the fluxon traveling along the Josephson transmission line thereby to cause the fluxon to stop at said fluxon stopping position without extinguishing said fluxon;
   at least one fluxon driving current source connected to said at least one fluxon stopping position for driving the fluxons which stop at the fluxon stopping position by the Lorentz force generated between bias current selectively applied to said transmission line and magnetic flux of said fluxons; and
   at least one output circuit connected across the pair of superconducting layers for extracting at least a part of the current involved with one or more fluxons present in the Josephson transmission line.

2. A Josephson transmission line device according to claim 1, wherein one of the superconducting layers has a larger surface area than the other, the two superconducting layers are joined by the junction, an insulator is provided along one side edge of the Josephson transmission line, a resistor element is provided on one surface of the insulator layer, and the opposite ends of the resistor element are connected to the respective superconducting layers by connector elements.

3. A Josephson transmission line device according to claim 1, further provided on the Josephson transmission line at a point between said fluxon stopping position and the output end thereof with an auxiliary current source for controlling the propagating velocity of fluxons.

4. A Josephson transmission line device according to claim 1, wherein a plurality of Josephson transmission lines each having one fluxon generating current source and at least one fluxon stopping position are serially connected through resistors and an output circuit is connected to the output end of the final Josephson transmission line, thereby to constitute a shift register wherein fluxons input, in parallel, to the respective Josephson transmission lines as logic signals by the fluxon generating current sources can be serially read out to the output circuit.

5. A Josephson transmission line device according to claim 1, wherein two Josephson transmission lines each having one fluxon generating current source and at least one fluxon stopping position are disposed with their output ends in parallel so as to constitute an input gate, a third Josephson transmission line having one fluxon generating current source and at least one fluxon stopping position is serially connected to the input gate through resistors so as to constitute an output gate and the Josephson transmission line constituting the output gate is provided with an output circuit, thereby to constitute a logical AND circuit wherein a fluxon is generated in the Josephson transmission line constituting the output gate only when fluxons present in both of the Josephson transmission lines constituting the input gate are output to the Josephson transmission line constituting the output gate.

6. A Josephson transmission line device according to claim 1, wherein at least two stopping positions are formed on the Josephson transmission line and a fluxon generating current source is connected to the transmission line between each adjacent pair of stopping positions, whereby two fluxons having oppositely circulating vortex currents are generated in the Josephson transmission line, travel in opposite directions and stop one each at the adjacent fluxon stopping positions when the fluxon generating current source supplies current to the Josephson transmission line.

7. A Josephson transmission line device according to claim 6, wherein at least two portions of the Josephson transmission line having adjacent pairs of fluxon stopping positions have fluxon generating current sources connected thereto and output circuits are connected to both ends of the Josephson transmission line, thereby to constitute a logical OR circuit.

8. A Josephson transmission line device according to claim 1, wherein the Josephson transmission line has at least one fluxon stopping position to which a fluxon driving current source is connected and has a high-impedance output circuit connected to one end thereof, thereby to constitute a frequency divider wherein a part of the vortex current of fluxons traveling to the one end is output to the ouput circuit and the remainder thereof is reflected at the one end and caused to travel in the opposite direction.

9. A Josephson transmission line device according to claim 8, wherein the fluxon driving source is arranged to successively apply fluxon driving current pulses of a fixed period to the fluxon stopping position so as to cause a fluxon initially stopped at the stopping position to travel alternately to the opposite ends of the Josephson transmission line during fixed time intervals, the major part of its energy being reflected at the ends and a minor part of its energy being output to an output circuit at one end of the Josephson transmission line so that the output circuit receives a train of output pulses of a period twice that of the fixed period.

10. A Josephson transmission line device according to claim 8 wherein the fluxon driving source is arranged to apply a fluxon driving current pulse having fixed pulse width to the fluxon stopping position so as to immediately send a fluxon arriving at the stopping position from one side to the opposite side, the major part of its energy being reflected at the ends and a minor part of its energy being output to an ouput circuit at one end of the Josephson transmission line so that the output circuit receives a train of output pulses of a fixed period.

11. A Josephson transmission line device according to claim 1, further comprising a feedback circuit connected between the point where the fluxon generating current source is connected to the Josephson transmission line and the point where the output circuit is connected thereto, whereby a part of the output obtained at the output circuit is fed back to the point where the fluxon generating current source is connected to cause a fluxon to be generated in the Josephson transmission line.

12. A Josephson transmission line device according to claim 11, wherein the fluxon driving current source is arranged to apply driving current pulses to the fluxon stopping positions, whereby pulse signals corresponding to the driving current pulses are output to the output circuit.

13. A Josephson transmission line device according to claim 12, wherein the fluxon driving current source is arranged to apply driving current pulses to the stopping position at intervals which are longer than the time required for a fluxon leaving the fluxon stopping position to return via feedback circuit.

14. A Josephson transmission line device according to claim 12, wherein the fluxon driving current source is arranged to apply to the fluxon stopping position driving current pulses of a period $T_f$ which satisfies the following relationship with respect to the time $T_s$ required for a fluxon leaving the fluxon stopping position to return thereto via the feedback circuit:

$(n-1)T_s < T_f < nT_s,$ whereby there is constituted a frequency divider wherein pulse signals are output to the output circuit at intervals which are n times longer than the intervals of the driving current pulses, n being an integer greater than one.

15. A Josephson transmission line device according to claim 11, wherein the fluxon driving current source is arranged to continuously apply driving current to the stopping position so as to endlessly repeat the operation of causing the fluxons present in the Josephson transmission line to be output to the output circuit and returned to the Josephson transmission line through the feedback circuit, whereby a pulse signal of a fixed pulse interval is continuously output to the output circuit.

16. A Josephson transmission line device according to claim 11, wherein the Josephson transmission line is provided with first and second fluxon stopping positions each having at least one fluxon driving current source connected thereto.

17. A Josephson transmission line device according to claim 16 wherein the first fluxon stopping position is provided with a fluxon driving current source and the second fluxon stopping position is provided with a pair of fluxon driving current sources, whereby logic signals representing the result of logical AND or NOT operations with respect to the logic signals represented by the fluxon driving currents from the two of three fluxon driving current sources are output to the output circuit.

18. A Josephson transmission line device according to claim 16 wherein the first fluxon stopping position is provided with a plurality of fluxon driving current sources and the second fluxon stopping position is provided with a fluxon driving current source, whereby a logic signal representing the result of a logical OR operation with respect to the logic signals represented by the fluxon driving currents from the plurality of fluxon driving current sources is output to the output circuit.

19. A Josephson transmission line device according to claim 11 wherein the Josephson transmission line is provided with the first and second fluxon stopping positions each of which is connected through a resistor to a common fluxon driving current source arranged to apply a pulse train simultaneously to both fluxon stopping positions as fluxon driving current pulses, whereby a fluxon is sent alternately to one and the other of the fluxon stopping positions and a pulse is output to the output circuit once for every two period of the fluxon driving current pulse train.

20. A Josephson transmission line device according to claim 11, wherein a large number of fluxon stopping positions each connected to a fluxon driving source are provided in the Josephson transmission line.

21. A Josephson transmission line device according to claim 20, wherein the fluxon generating current source is arranged to input logic signals representing a digital number having a number of digits corresponding to the number of fluxon stopping positions and the fluxon driving current sources are arranged to supply pulses to all fluxon stopping positions simultaneously at the time of reading, whereby the logic signals input to the respective fluxon stopping positions are read out serially to the output circuit and are further fed back through the feedback circuit to again input the logic signal to the Josephson transmission line.

22. A Josephson transmission line device according to claim 11, wherein the Josephson transmission line is split at a point further from the input end thereof than the fluxon stopping position to form an input side Josephson transmission line segment and an output side Josephson transmission line segment, the input and output side Josephson transmission line segments being connected by a connecting circuit of the same construction as the feedback circuit, an output circuit for extracting a part of the energy of the fluxons traveling through the input side Josephson transmission line segment as an output current is connected between the input side Josephson transmission line segment and the connecting circuit, and a second fluxon generating current source is connected between the connecting circuit and the output side Josephson transmission line segment for regenerating fluxons in the output side Josephson transmission line segment.

23. A Josephson transmission line device according to claim 1, further comprising at least two Josephson transmission lines each having at least one fluxon stopping position, the at least two Josephson transmission lines being formed into a Josephson transmission line loop by connecting the point of each Josephson transmission line at which the associated fluxon generating current source is connected with the point of another Josephson transmission line at which the associated output circuit is connected, by means of a feedback circuit or connecting circuit constituted of first and second conductors, whereby the fluxons in the Josephson transmission line loop can be extracted as desired at the respective output circuits.

24. A Josephson transmission line device according to claim 11, further comprising a first Josephson transmission line having first and second fluxon stopping positions which are connected through respective resistors to a common fluxon driving current source and a second Josephson transmission line having first and second fluxon stopping positions which can be supplied with fluxon driving current through respective resistors connected thereto, the second Josephson transmission line being series-connected to the first Josephson transmission line at the point of the first Josephson transmission line at which the associated output circuit is connected.

25. A Josephson transmission line device according to claim 24, wherein at least one Josephson transmission line having first and second fluxon stopping positions which can be supplied with fluxon driving current through respective resistors is series-connected to the output end of the second Josephson transmission line.

26. A Josephson transmission line device according to claim 11, further comprising at least one auxiliary current source connected to at least one of a plurality of Josephson transmission lines for controlling the propagation velocity of fluxons within the Josephson transmission line 27. A Josephson transmission line device according to claim 11, further comprising at least one auxiliary output circuit connected to at least one of a plurality of Josephson transmission lines for extracting at least a part of the energy of fluxons traveling within the Josephson transmission line as an output signal.

28. A Josephson transmission line device according to claim 11, further comprising first and second Josephson transmission lines respectively having first and second fluxon stopping positions connected through respective resistors to a single input line which has at least two fluxon driving current sources connected in parallel therewith, the point of the first Josephson transmission line at which the associated output circuit is connected being connected to the input line connected to the fluxon driving current source of the second Josephson transmission line.

29. A Josephson transmission line device according to claim 28, wherein at least one Josephson transmission line having first and second fluxon stopping positions which can be supplied with fluxon driving current through respective resistors is series-connected to the output end of the second Josephson transmission line.

30. A Josephson transmission line device according to claim 1, wherein the length of the Josephson transmission line is four or more times the Josephson penetration depth and the width thereof is less than the Josephson penetration depth.

31. A Josephson transmission line device according to claim 1, wherein the fluxon generating current source is arranged to supply a continuous direct current bias to the Josephson transmission line and to superimpose a current pulse on the direct current bias when a fluxon is to be generated.

32. A Josephson transmission line device according to claim 1, wherein the fluxon generating current source is arranged to apply to the Josephson transmission line a direct current bias $I_{eo}$ satisfying the following relationship:

$$I_{eo} < 2 \cdot \lambda_j \cdot w \cdot I_o$$

where $\lambda_J$ is the Josephson penetration depth, w is the width of the Josephson transmission line and $I_o$ is the maximum Josephson current density.

33. A Josephson transmission line device according to claim 1, wherein at least one of the superconducting layers constituting the Josephson transmission line is formed of Pb-Au alloy.

34. A Josephson transmission line device according to claim 1, wherein at least one of the superconducting layers constituting the Josephson transmission line is formed of Pb-In-Au alloy.

35. A Josephson transmission line device according to claim 1, wherein one of the superconducting layers constituting the Josephson transmission line is formed of Pb-Au alloy and the other is formed of Pb-In-Au alloy.

36. A Josephson transmission line device according to claim 35, wherein the junction between the superconducting layers of the Josephson transmission line is formed of an oxide film of Pb-In-Au by discharging.

37. A Josephson transmission line device according to claim 33, wherein the junction between the superconducting layers of the Josephson transmission line is formed of an oxide film of Pb-In-Au by discharging.

38. A Josephson transmission line device according to claim 1, wherein at least one of the superconducting layers constituting the Josephson transmission line is formed of niobium nitride.

39. A Josephson transmission line device according to claim 38, wherein the junction between the superconducting layers constituting the Josephson transmission line is formed of a film of niobium oxide.

40. A Josephson transmission line device according to claim 1, wherein said resistor element comprises first and second portions provided on both of said superconducting layers on the sides thereof opposite from the junction and a third portion provided on one side edge of the Josephson transmission line to connect said first and second portions with each other.

41. A Josephson transmission line device according to claim 1, wherein an insulator layer is provided along one side edge of the Josephson transmission line, said resistor element comprising first and second portion provided on both of said superconducting layers on the sides thereof opposite from the junction, and a third portion provided on the outer periphery of the insulator layer to connect said first and second portions with each other.

42. A Josephson transmission line device according to claim 1, wherein one of the superconducting layers has a larger surface area than the other, the two superconducting layers are joined by the junction, an insulator layer is provided along one side edge of the superconducting layer having the smaller area, and said resistor element comprises a first portion provided on the superconducting layer having the smaller area on the side thereof, a second portion provided on the superconducting layer having the larger area on a surface thereof facing the junction, and a third portion provided on the outer periphery of the insulating layer to connect the first and second portions with each other.

43. A Josephson transmission line device according to claim 1, wherein an insulating layer is provided along one side edge of the Josephson transmission line, said resistor element is provided on one surface of the insulator layer, and the opposite ends of said resistor element are connected to the respective superconducting layers by connector elements.

44. A Josephson transmission line according to claim 1, further providing, on the Josephson transmission line at a point between said fluxon stopping position and the output circuit, a second output circuit for extracting a part of the vortex current of fluxons traveling along the Josephson transmission line.

45. A Josephson transmission line device according to claim 1, wherein a plurality of fluxon stopping positions are provided in the Josephson transmission line and the respective stopping positions are connected with at least one driving current source each.

46. A Josephson transmission line device according to claim 45, wherein the plurality of fluxon stopping positions is divided into one group of odd-numbered stopping positions and another group of even-numbered stopping positions as reckoned from the end of the Josephson transmission line connected to the fluxon generating current source, a first group of fluxon driving current sources is provided for the odd-numbered fluxon stopping positions to supply thereto first clock pulses of a given phase and a second group of fluxon driving current sources is provided for the even-numbered fluxon stopping positions to supply thereto second clock pulses differing in phase from the first clock pulses by 180°, thereby to constitute an n-bit register wherein fluxons generated in the Josephson transmission line by the fluxon generating current source are progressively transferred along the fluxon stopping positions by the first and second clock pulses, n being an integer greater than one.

47. A Josephson transmission line device according to claim 45, wherein the fluxon driving current sources are arranged to apply simultaneously to all of the plurality of fluxon stopping positions fluxon driving current in the form of clock pulses of a pulse width which is smaller than the time interval required for a fluxon to travel from a given fluxon stopping position to the adjacent fluxon stopping position, thereby to constitute an n-bit shift register wherein fluxons generated in the Josephson transmission line by the fluxon generating current source are progressively transferred along the fluxon stopping positions, n being an integer greater than one.

48. A Josephson transmission line device according to claim 45 wherein the Josephson transmission line is further provided with branch output circuits at points between the plurality of fluxon stopping positions, whereby there is constituted a shift register enabling the information carried by fluxons serially input by the fluxon generating current source to be in parallel read out, in parallel, to the branch output circuits.

49. A Josephson transmission line device comprising:
   at least one Josephson transmission line consisting of a pair of superconducting layers and a junction layer disposed between said superconducting layers to constitute a Josephson junction;
   at least one fluxon generating current source connected across the pair of superconducting layers for supplying fluxon generating current to the Josephson transmission line in order to generate fluxons therein;
   at least one resistor element provided inside one of the superconducting layers so as to form a fluxon stopping position in said Josephson transmission line, said fluxon stopping position being adapted to consume the energy of movement of the fluxon traveling along the Josephson transmission line thereby to cause the fluxon to stop at said fluxon stopping position without extinguishing said fluxon;
   at least one fluxon driving current source connected to said at least one fluxon stopping position for driving the fluxons which stop at the fluxon stopping position by the Lorentz force generated between bias current selectively applied to said transmission line and magnetic flux of said fluxons; and
   at least one output circuit connected across the pair of superconducting layers for extracting at least apart of the current involved with one or more fluxons present in the Josephson transmission line.

50. A Josephson transmission line device comprising:
   at least one Josephson transmission line consisting of a pair of superconducting layers and a junction layer disposed between said superconducting layers to constitute a Josephson junction;
   at least one fluxon generating current source connected across the pair of superconducting layers for supplying fluxon generating current to the Josephson transmission line in order to generate fluxons therein;
   resistor elements provided on both of said superconducting layers on the sides thereof opposite from the Josephson junction so as to form a fluxon stopping position in said Josephson transmission line between said resistor elements, said fluxon stopping position being adapted to consume the energy of movement of the fluxon traveling along the Josephson transmission line thereby to cause the fluxon to stop at said fluxon stopping position without extinguishing said fluxon;
   at least one fluxon driving current source connected to said at least one fluxon stopping position for driving the fluxons which stop at the fluxon stopping position by the Lorentz force generated between bias current selectively applied to said transmission line and magnetic flux of said fluxons; and
   at least one output circuit connected across the pair of superconducting layers for extracting at least a part of the current involved with one or more fluxons present in the Josephson transmission line.

* * * * *